US012794490B2

(12) United States Patent
Cooper et al.

(10) Patent No.: US 12,794,490 B2
(45) Date of Patent: Nov. 10, 2026

(54) COLLABORATIVE TRANSFORMATION MATRIX LEARNING FOR DISTRIBUTED DATA COMPRESSION AND ENCRYPTION SYSTEMS

(71) Applicant: AtomBeam Technologies Inc., Moraga, CA (US)

(72) Inventors: Joshua Cooper, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 19/391,007

(22) Filed: Nov. 17, 2025

(65) Prior Publication Data

US 2026/0074711 A1 Mar. 12, 2026

Related U.S. Application Data

(63) Continuation-in-part of application No. 19/185,173, filed on Apr. 21, 2025, now Pat. No. 12,500,605, (Continued)

(51) Int. Cl.
*G06F 7/00* (2006.01)
*G06N 20/00* (2019.01)
*H03M 7/30* (2006.01)

(52) U.S. Cl.
CPC .......... *H03M 7/3059* (2013.01); *G06N 20/00* (2019.01); *H03M 7/6005* (2013.01)

(58) Field of Classification Search
CPC ............. G06F 16/217; G06F 16/24553; G06F 16/24578; G06F 16/24; G06F 16/13;
(Continued)

(56) References Cited

U.S. PATENT DOCUMENTS 9,524,392 B2 12/2016 Naehrig et al.
11,481,929 B2 10/2022 Chang et al.
(Continued)

*Primary Examiner* — Mohammad A Sana
(74) *Attorney, Agent, or Firm* — GALVIN PATENT LAW LLC; Brian R. Galvin; Erin L. Johnston

(57) ABSTRACT

A collaborative transformation matrix learning system extends adaptive compression and encryption architectures through federated, privacy-preserving optimization. Each node analyzes local data distributions to generate anonymized distribution profiles using differential-privacy mechanisms, securely exchanging profiles and validated transformation matrices across a collaborative network. A trust and validation engine verifies mathematical properties and evaluates claimed performance metrics. Validated matrices are integrated into local optimization when trust and performance thresholds are satisfied. The system employs secure multi-party computation, homomorphic encryption, and conflict-resolution logic to ensure integrity of shared insights while preventing exposure of sensitive information. By combining collective learning with local adaptation, the invention accelerates convergence to optimal matrix configurations, mitigates cold-start inefficiencies, and improves compression-encryption efficiency and cryptographic strength across distributed deployments.

16 Claims, 15 Drawing Sheets

Related U.S. Application Data which is a continuation-in-part of application No. 18/770,652, filed on Jul. 12, 2024, now Pat. No. 12,283,975, which is a continuation-in-part of application No. 18/503,135, filed on Nov. 6, 2023, now Pat. No. 12,237,848, which is a continuation of application No. 18/305,305, filed on Apr. 21, 2023, now Pat. No. 11,811,428, which is a continuation-in-part of application No. 18/190,044, filed on Mar. 24, 2023, now Pat. No. 11,831,343.

(60) Provisional application No. 63/485,518, filed on Feb. 16, 2023, provisional application No. 63/388,411, filed on Jul. 12, 2022.

(58) Field of Classification Search
CPC ............. G06F 16/2272; G06F 16/2425; G06F 16/2428; G06F 16/2455; G06F 16/248; G06F 16/14; G06F 16/38; G06F 16/334; G06F 16/35; H03M 7/3059; H03M 7/6005; H03M 7/3079; H03M 7/4037; H03M 7/6035; G06N 20/00; G06N 5/04
See application file for complete search history.

(56) References Cited

U.S. PATENT DOCUMENTS

| | | | | |
|---|---|---|---|---|
| 11,763,157 | B2 | 9/2023 | Srinivasan et al. | |
| 12,283,975 | B2 * | 4/2025 | Cooper | H04L 9/065 |
| 12,500,605 | B2 * | 12/2025 | Cooper | H03M 7/3059 |
| 2014/0064479 | A1 * | 3/2014 | Manikandan | H03M 7/3062 380/28 |
| 2018/0196609 | A1 | 7/2018 | Niesen | |
| 2020/0395955 | A1 | 12/2020 | Choi et al. | |
| 2021/0133577 | A1 * | 5/2021 | Srinivasan | G06N 3/045 |
| 2021/0287404 | A1 * | 9/2021 | Chang | H04N 19/12 |

* cited by examiner

COLLABORATIVE TRANSFORMATION MATRIX LEARNING FOR DISTRIBUTED DATA COMPRESSION AND ENCRYPTION SYSTEMS

CROSS-REFERENCE TO RELATED APPLICATIONS

Priority is claimed in the application data sheet to the following patents or patent applications, each of which is expressly incorporated herein by reference in its entirety:

Ser. No. 19/185,173
Ser. No. 18/770,652
Ser. No. 18/503,135
Ser. No. 18/305,305
Ser. No. 18/190,044
63/388,411
63/485,518

BACKGROUND OF THE INVENTION

Field of the Art

The present invention relates to the field of data processing and cryptography, and more specifically to collaborative and privacy-preserving systems for adaptive compression and encryption using federated transformation matrix learning across distributed networks.

Discussion of the State of the Art

Data compression and encryption technologies have long been central to efficient and secure digital communication and storage. Traditional approaches generally treat these processes as separate operations: data is first compressed to reduce size and then encrypted to ensure confidentiality. While effective in some contexts, this sequential approach introduces inefficiencies, including redundant data processing, increased computational overhead, and larger cumulative latency. Moreover, independent compression and encryption stages often produce conflicting optimizations-compression algorithms seek to identify and exploit data regularities, while encryption algorithms seek to obscure them entirely.

Recent innovations, including integrated compression-encryption techniques such as dyadic distribution-based encoding, have sought to unify these operations into a single pass. Such systems transform input data into a modified statistical distribution optimized for compression while simultaneously introducing cryptographic randomness to enhance security. The prior art in this domain has demonstrated significant performance gains, particularly when adaptive transformation matrices are used to adjust system parameters dynamically in response to evolving data characteristics. These adaptive systems enable each instance to refine its transformation matrices over time, improving efficiency and maintaining strong cryptographic properties as data distributions drift.

However, adaptive transformation systems as known in the art typically operate in isolation, with each deployment learning optimal transformation parameters independently. This independence introduces several limitations. First, each new system instance must undergo an initial learning phase, often referred to as the cold-start problem, during which compression and security performance may be suboptimal until sufficient data has been analyzed. Second, when multiple deployments process similar types of data, redundant computational effort is wasted as each system independently converges toward nearly identical matrix configurations. Third, because these systems lack a secure mechanism for sharing insights, valuable optimization knowledge gained by one deployment cannot benefit others. Attempts to introduce distributed or collaborative learning in related domains—such as federated model training or peer-based optimization—have largely focused on conventional machine learning models and do not address the specific mathematical and security requirements of dyadic distribution-based compression and encryption. Furthermore, known distributed learning approaches often fail to provide adequate privacy guarantees, risking exposure of sensitive information when sharing statistical summaries across nodes.

As a result, the field lacks an efficient and privacy-preserving mechanism through which multiple adaptive compression and encryption systems can securely share anonymized distribution insights, validated transformation matrices, and performance metrics to accelerate convergence and improve overall efficiency. Existing approaches either compromise privacy or fail to ensure the mathematical and cryptographic integrity of shared information, limiting their applicability to security-critical or distributed data environments.

What is needed is a collaborative transformation matrix learning system that enables multiple adaptive compression and encryption deployments to securely exchange anonymized distribution profiles and validated transformation matrices across a distributed network, thereby overcoming the cold-start problem, accelerating adaptation, and improving performance while preserving privacy, ensuring trustworthiness, and maintaining compatibility with existing adaptive compression and encryption architectures.

SUMMARY OF THE INVENTION

Accordingly, the inventor has conceived and reduced to practice a collaborative transformation matrix learning system that extends the capabilities of adaptive compression and encryption platforms to operate within a distributed, privacy-preserving network of interconnected instances. The invention enables multiple deployed systems to cooperatively accelerate the learning and optimization of transformation matrices used for simultaneous compression and encryption, without disclosing sensitive data or compromising security. Each system instance analyzes its local data distributions, generates anonymized distribution profiles, and securely exchanges these profiles and validated transformation matrices with other trusted nodes. Through federated collaboration, the system overcomes the limitations of isolated adaptive learning by leveraging the collective intelligence of the network, ensuring faster convergence to optimal configurations, enhanced performance across diverse data types, and consistent maintenance of cryptographic strength and compression efficiency.

In an embodiment, a computer system comprises a hardware memory configured to execute software instructions stored on nontransitory machine-readable storage media. The system analyzes an input data stream to determine its statistical properties and creates a transformation matrix based on those properties. The input data is transformed into a modified statistical distribution of symbols shaped according to a dyadic distribution defined by the transformation matrix. The system generates a main data stream of transformed data and a secondary data stream containing transformation information, compresses the main data stream, and combines both streams into a single output stream protected by security measures. The system continuously monitors incoming data to detect changes in its statistical distribution patterns and generates updated transformation matrices when distribution shifts occur, selecting and deploying an optimal matrix based on performance evaluation criteria. The system further generates a privacy-preserving distribution profile that represents characteristics of the observed distributions using differential privacy mechanisms and securely communicates with at least one remote node in a collaborative network to exchange these anonymized distribution profiles, transformation matrix configurations, and associated performance metrics. When a transformation matrix is received from another node, the system validates it by verifying its mathematical properties and claimed performance, then integrates the validated matrix into local selection processes when it meets or exceeds defined evaluation thresholds.

In an aspect of an embodiment, validating the remotely sourced transformation matrix includes verifying that it maintains the row-stochastic properties required by the dyadic distribution algorithm.

In an aspect of an embodiment, the system assigns a trust score to each remote node based on the historical reliability of previously received transformation matrices, integrating a matrix from a node only when its trust score exceeds a predetermined threshold.

In an aspect of an embodiment, the trust score is dynamically updated by comparing actual performance of the validated matrix against its associated performance metrics, refining the reputation of contributing nodes based on demonstrated accuracy.

In an aspect of an embodiment, the system applies a remotely sourced transformation matrix to locally generated test data samples to measure actual compression efficiency, integrating the matrix only if observed performance meets or exceeds reported results.

In an aspect of an embodiment, generating the privacy-preserving distribution profile includes applying dimensionality reduction to detailed distribution statistics to create a fixed-length vector that captures essential distribution characteristics while preventing reconstruction of individual data points.

In an aspect of an embodiment, the system maintains a local repository of transformation matrix configurations received from remote nodes, indexes the repository according to similarity between distribution profiles, and retrieves candidate matrices from this repository to assist in generating new matrices when data distribution changes are detected.

In an aspect of an embodiment, when a discrepancy arises between local performance results and the reported performance metrics of a remotely sourced matrix, the system resolves the conflict by adjusting the trust score associated with the contributing node to reflect the inconsistency.

The corresponding method embodiments perform the same operations through computer-implemented steps executed by one or more processors, encompassing the same functional limitations as the system described above, and are therefore applicable to all aspects of the invention without restatement.

BRIEF DESCRIPTION OF THE DRAWING FIGURES

FIG. 1 illustrates an exemplary overall system architecture of a collaborative transformation matrix learning system showing relationships among core adaptive components and collaborative learning components and depicting data flow between a data distribution analyzer, distribution profile generator, network synchronization manager, collaborative learning coordinator, matrix performance repository, trust and validation engine, privacy-preserving aggregator, conflict resolution manager, federated matrix constructor, deployment compatibility manager, performance prediction engine, matrix selection controller, transformation matrix generator, dyadic distribution module, and Huffman encoder/decoder.

DETAILED DESCRIPTION OF THE INVENTION

Figure 1:
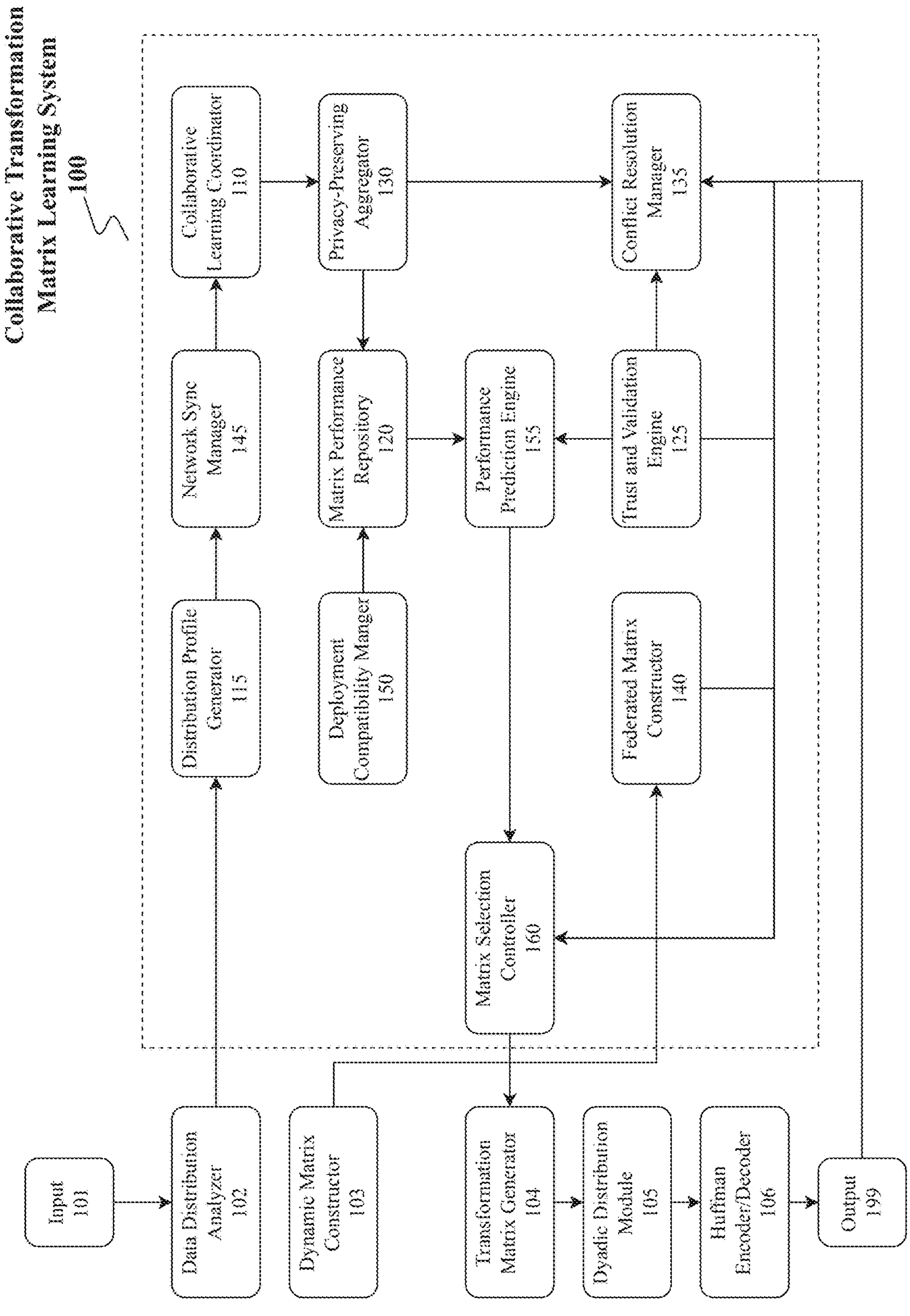

The inventor has conceived and reduced to practice a system and method for a federated learning system for adaptive compression and encryption with privacy-preserving matrix sharing. The present application builds upon and is fully compatible with the adaptive transformation matrix generation system described in U.S. application Ser. No. 19/185,173, the entirety of which is incorporated herein by reference.

A collaborative transformation matrix learning system enables multiple deployed instances of adaptive compression and encryption systems to share distribution insights and validated matrix configurations across a distributed network. The system implements a federated learning architecture where participating nodes contribute distribution profiles, performance metrics, and successful matrix configurations to a shared knowledge base while maintaining data privacy and security. The collaborative system addresses challenges associated with initial deployment by providing access to previously validated matrix configurations when encountering novel data distributions. Through validation protocols and trust-scoring mechanisms, the system supports quality assurance for collaboratively learned matrices before local adoption. Privacy-preserving aggregation techniques protect information about individual deployments' data characteristics while enabling meaningful knowledge sharing. The collaborative system maintains compatibility with standalone operation, allowing deployments to function independently when network connectivity is unavailable or when privacy requirements preclude participation.

A collaborative learning coordinator serves as a central orchestration component that manages aspects of federated matrix learning and distribution across participating nodes. The coordinator maintains a registry of participating nodes in a collaborative network, tracking their operational status, trust scores, and contribution history over time. Session management protocols establish secure communication channels between participating nodes, coordinating timing and sequencing of knowledge sharing operations to reduce network overhead and address potential conflicts. A scheduling engine within the coordinator determines intervals for knowledge exchange based on network conditions, individual node activity patterns, and rates of distribution changes observed across the network. The coordinator implements version control mechanisms that track evolution of shared matrix configurations, maintaining compatibility metadata that supports proper interpretation and integration of matrices generated by different system versions. When multiple nodes simultaneously contribute insights about similar distribution patterns, an aggregation engine combines these contributions using weighted averaging algorithms that account for each node's trust score and statistical confidence of their observations.

A distribution profile generator creates anonymized representations of data distribution characteristics that can be shared across a collaborative network without exposing information about actual data being processed. The generator receives detailed distribution statistics from a local data distribution analyzer and applies dimensionality reduction techniques to create profile vectors of fixed dimensionality that capture distribution characteristics while discarding identifying details. Differential privacy mechanisms add calibrated noise to distribution statistics, supporting privacy protection for individual data points while maintaining accuracy for collaborative learning purposes. Feature extraction algorithms identify salient characteristics of data distributions including entropy measures, moment statistics, frequency domain representations, and autocorrelation patterns, encoding these into a standardized profile format that remains consistent across different system deployments and versions. The generator creates temporal fingerprints that characterize how distributions evolve over time, enabling other nodes to recognize similar distribution shift patterns and adapt their matrices when encountering comparable patterns locally. Profile vectors flow from the generator to network communication interfaces for transmission to other participating nodes in the collaborative network.

A matrix performance repository maintains a distributed database of transformation matrix configurations and their associated performance metrics across multiple operational contexts and data distribution types. Each repository entry includes a complete matrix specification, a distribution profile under which the matrix was optimized, performance metrics covering compression efficiency, cryptographic strength, and computational overhead, and metadata describing operational mode, system version, and environmental conditions under which performance was measured. Indexing mechanisms enable retrieval of relevant matrix configurations based on similarity matching between current distribution profiles and historical profiles associated with stored matrices. A performance prediction engine within the repository estimates likely effectiveness of stored matrices for novel distribution patterns by interpolating between known performance points in a distribution space, allowing nodes to identify candidate matrices without exhaustive local evaluation. The repository maintains temporal tracking of matrix performance, identifying configurations that remain effective across extended periods and those that may degrade over time as data characteristics drift. When storage constraints require pruning of repository contents, retention policies preserve matrices with broad applicability, exceptional performance characteristics, or coverage of distribution types while discarding redundant or underperforming configurations.

A trust and validation engine supports integrity and quality of collaboratively shared matrices and distribution insights through verification protocols and reputation management systems. The engine assigns initial trust scores to newly participating nodes based on cryptographic identity verification and credentials, then updates these scores based on quality and reliability of their contributions over time. When a node shares a matrix configuration, the validation engine subjects the matrix to mathematical verification, confirming that the matrix maintains row-stochastic properties, satisfies constraints imposed by a dyadic distribution algorithm, and exhibits numerical stability across expected ranges of input values. Performance claim verification applies shared matrices to standardized test datasets and compares actual performance against metrics claimed by a contributing node, flagging discrepancies that may indicate measurement errors or environmental factors affecting performance. Anomaly detection algorithms identify patterns such as nodes sharing underperforming matrices, contribution patterns that correlate with known signatures, or changes in a previously reliable node's contribution quality. The engine maintains audit logs of validation activities and trust score adjustments, providing transparency and accountability in a collaborative learning process while enabling forensic analysis if incidents occur.

A privacy-preserving aggregator implements cryptographic protocols and statistical techniques to enable knowledge sharing while protecting information about individual deployments' data characteristics and operational patterns. The aggregator employs secure multi-party computation protocols that allow multiple nodes to jointly compute aggregate statistics over their combined distribution observations without any single node learning details about others' data. Homomorphic encryption techniques enable nodes to share encrypted performance metrics that can be mathematically combined and compared without decryption, preventing exposure of individual performance characteristics while enabling identification of superior matrix configurations. The aggregator implements k-anonymity requirements such that shared distribution profiles match observations from multiple nodes before release, protecting nodes from fingerprinting approaches. When aggregating performance metrics across multiple nodes, the aggregator applies robust statistical methods such as median-based aggregation or trimmed means that reduce influence of outliers or contributions that may not represent typical performance. The aggregator manages trade-offs between privacy protection and utility, implementing adaptive privacy budgets that allow nodes to control how much information they share and automatically adjusting privacy parameters based on sensitivity of their operational context.

A conflict resolution manager addresses situations where locally-learned knowledge contradicts insights shared from a collaborative network, implementing algorithms to determine which information sources should take precedence in different scenarios. The manager maintains a comparison framework that evaluates conflicts across dimensions including statistical confidence of local versus shared observations, recency of information, consistency with historical patterns, and alignment with a deployment's operational requirements and constraints. When local performance measurements for a collaboratively shared matrix differ from shared metrics, the manager investigates potential explanations including environmental differences between deployments, version incompatibilities, measurement methodology variations, or performance variability across different data contexts. The manager implements graduated response protocols that range from flagging discrepancies for review in low-confidence situations, through automatic adjustment of trust scores for a contributing node, to rejection of shared matrices that underperform local alternatives. Learning algorithms within the manager identify systematic patterns in conflicts, such as matrices that perform differently across certain operational modes or distribution types where collaborative insights prove less reliable, using these patterns to refine future acceptance criteria. The manager provides feedback to a collaborative network about identified conflicts, contributing to collective knowledge about matrix performance boundaries and supporting improvement of future shared insights.

A federated matrix constructor extends capabilities of a local dynamic matrix constructor by integrating collaboratively learned insights into a matrix generation process, supporting adaptation and matrix quality improvements through collective intelligence. The constructor maintains an approach where local observations drive primary optimization but collaborative insights inform initial configurations, constraint definitions, and search space exploration strategies. When generating candidate matrices for a newly detected distribution pattern, the constructor queries a matrix performance repository for similar historical patterns and uses retrieved configurations as starting points for local optimization, reducing search space and computational requirements compared to generating matrices without reference to prior work. Transfer learning techniques identify structural patterns in successful matrices across different distribution types, extracting optimization principles that can be applied when generating matrices for novel distributions not yet covered by collaborative knowledge. An ensemble generation capability creates multiple candidate matrices drawing from different sources, with some based on local optimization, others adapted from collaborative insights, and hybrid candidates that blend both approaches, allowing a performance evaluation engine to select a configuration for a specific local context. The constructor contributes back to a collaborative network by identifying effective matrix configurations generated through local innovation, packaging them with metadata and performance metrics for sharing with other nodes.

A network synchronization manager handles timing, coordination, and sequencing of collaborative learning operations across distributed deployments, supporting knowledge exchange while managing network overhead and preventing resource conflicts. The manager implements adaptive synchronization schedules that adjust frequency of knowledge exchange based on rate of distribution changes observed locally, network bandwidth availability, and staleness of information in a local matrix performance repository. Bandwidth management protocols prioritize transmission of insights such as matrices for novel distribution types or configurations with exceptional performance characteristics, while deferring lower-priority updates during periods of network congestion. The manager maintains awareness of temporal patterns in collaborative activity, identifying windows for synchronization that may avoid periods of peak network utilization or high local computational load, while supporting propagation of updates that provide value to receiving nodes. When network partitions occur isolating subsets of nodes, the manager implements partition-aware protocols that maintain local collaboration within connected subgroups and implement reconciliation procedures when connectivity is restored, addressing potential conflicts and supporting consistency of shared knowledge. The manager provides quality-of-service support for time-critical operations such as security threat intelligence sharing, implementing priority queuing and expedited transmission for collaborative insights that may benefit from rapid propagation across a network.

A deployment compatibility manager addresses challenges of maintaining collaborative learning across heterogeneous deployments that may operate different system versions, serve different operational contexts, or implement varying feature sets and configuration options. The manager maintains capability profiles for each participating node, tracking their supported operational modes, matrix dimensionality constraints, performance metric definitions, and version-specific algorithm implementations. A translation engine within the manager converts matrices and distribution profiles between different representation formats when appropriate, supporting utilization of insights generated by one system version by nodes running different versions. Feature negotiation protocols identify common subsets of capabilities shared between nodes, focusing collaborative learning on aspects that participants can utilize while handling situations where advanced features available in some deployments cannot be shared with others. When version differences exist, the manager can initiate backward-compatible operation modes that limit shared insights to configurations that versions can process, supporting integration of matrices that behave consistently across system versions. The manager tracks evolution of compatibility requirements over time, identifying when network-wide version upgrades enable new collaborative learning capabilities and coordinating activation of these capabilities once nodes support them.

A performance prediction engine enables matrix optimization by forecasting likely effectiveness of candidate matrices before committing computational resources to exhaustive local evaluation, leveraging both local historical data and collaborative insights to guide optimization decisions. The engine maintains machine learning models trained on historical performance data that capture relationships between distribution characteristics, matrix properties, and resulting performance metrics across multiple evaluation dimensions. Through similarity-based prediction, the engine identifies matrix configurations from a repository whose associated distribution profiles closely match current local patterns, using their documented performance as predictive signals for expected local effectiveness. Confidence estimation quantifies uncertainty in performance forecasts based on degree of extrapolation required, density of training data in relevant regions of a distribution space, and consistency of historical performance patterns. When predictions indicate that multiple candidate matrices may perform similarly, the engine can recommend ensemble approaches or suggest additional evaluation criteria to guide selection, while predicted performance can eliminate candidates from consideration without local testing. The engine refines its models by comparing predictions against actual measured performance, implementing online learning algorithms that adapt to observed performance patterns and improve prediction accuracy over time, with learning occurring when predictions prove inaccurate, as these instances reveal aspects of performance determinants that may benefit from model refinement.

An input data stream flows to a local data distribution analyzer that monitors statistical properties and detects changes in distribution patterns over time. When distribution changes are detected, a distribution profile generator creates an anonymized representation of current distribution characteristics using differential privacy mechanisms and dimensionality reduction techniques. The anonymized distribution profile flows to a network synchronization manager that coordinates transmission to other participating nodes in a collaborative network via secure communication channels established by a collaborative learning coordinator. Simultaneously, the local system queries a matrix performance repository for previously validated transformation matrices associated with similar distribution profiles received from remote nodes. Retrieved candidate matrices flow to a trust and validation engine that verifies mathematical properties and evaluates performance claims against local test datasets. Validated matrices that meet quality criteria flow to a federated matrix constructor that integrates collaborative insights with locally-generated candidates. A performance evaluation engine compares effectiveness of all candidate matrices, and a matrix selection controller deploys an optimal configuration based on performance metrics and trust scores. The deployed matrix flows to a dyadic distribution module that applies transformations to incoming data, generating a main data stream for compression and a secondary data stream containing transformation information. Throughout this process, a conflict resolution manager monitors for discrepancies between local performance and shared metrics, adjusting trust scores and providing feedback to the collaborative network when conflicts are identified.

In a non-limiting example implementation, multiple healthcare organizations deploy adaptive compression and encryption systems for storing and transmitting medical imaging data across their respective networks. Each deployment independently operates a data distribution analyzer that monitors incoming DICOM medical image files, detecting changes in statistical distribution patterns as different imaging modalities and patient populations are encountered. When a first healthcare organization's system detects a shift toward computed tomography scans with specific contrast enhancement patterns, a dynamic matrix constructor generates transformation matrices optimized for this distribution, creating dyadic distributions shaped according to mathematical properties that enable efficient Huffman compression while maintaining cryptographic security through the system's inherent encryption properties.

The collaborative learning system extends this adaptive functionality by enabling the first healthcare organization to share its experience with other participating nodes. A distribution profile generator creates an anonymized representation of the CT scan distribution characteristics using differential privacy mechanisms, applying dimensionality reduction to create a fixed-length profile vector that captures entropy measures, moment statistics, and frequency domain characteristics without exposing protected health information or enabling reconstruction of individual patient images. This privacy-preserving distribution profile flows through a network synchronization manager to a collaborative learning coordinator, which maintains secure communication channels with other healthcare organizations participating in the federated learning network.

When a second healthcare organization subsequently begins receiving similar CT scan data weeks later, its data distribution analyzer detects the emerging pattern and queries a local matrix performance repository for relevant transformation matrices. The repository retrieves matrix configurations previously shared by the first healthcare organization, along with associated performance metrics indicating compression efficiency, cryptographic strength, and computational overhead measured during the first organization's processing of similar data. A trust and validation engine verifies that retrieved matrices maintain row-stochastic properties required by the dyadic distribution algorithm and applies the matrices to local test datasets to confirm performance claims. The validation engine considers trust scores previously assigned to the first healthcare organization based on historical accuracy of its shared matrices, with higher trust scores enabling faster adoption of new configurations.

A federated matrix constructor receives both the validated collaboratively-sourced matrices and locally-generated candidates, creating an ensemble of options for a performance evaluation engine to assess. Rather than requiring weeks of local learning to optimize transformation matrices for the new CT scan distribution, the second organization's system immediately benefits from the first organization's experience through access to previously validated configurations. The performance evaluation engine selects an optimal matrix based on combined evaluation criteria including compression ratios measured against local test data, cryptographic strength verified through modified next-bit tests, and confidence levels derived from both local validation and collaborative trust scores. The selected matrix flows to a transformation matrix generator that deploys it for processing incoming data streams.

As the second organization processes CT scan data using the collaboratively-sourced matrix, a conflict resolution manager continuously monitors actual performance against shared metrics. When local measurements closely match predicted performance, the system increases the trust score assigned to the first organization, strengthening confidence in future matrix contributions from that source. The second organization's federated matrix constructor identifies refinements to the original matrix that improve performance for its specific scanner configurations and patient demographics, packaging these enhanced configurations with updated performance metrics and transmitting them back through the collaborative network. A privacy-preserving aggregator combines insights from both organizations using secure multi-party computation protocols, creating aggregated performance statistics that benefit the entire network without exposing proprietary information about either organization's specific data characteristics or operational patterns.

When a third healthcare organization subsequently encounters the same CT scan distribution, its matrix performance repository contains validated configurations from both previous organizations, with performance metrics aggregated across multiple deployments providing higher confidence in predicted effectiveness. A performance prediction engine within the repository estimates likely local performance based on similarity matching between the third organization's current distribution profile and historical profiles associated with stored matrices, enabling rapid identification of promising candidates without exhaustive local evaluation. This progressive accumulation of collective knowledge across the federated network accelerates adaptation speed and improves matrix quality for each successive deployment encountering similar data patterns.

Throughout this collaborative process, the fundamental compression and encryption operations continue to function as designed. Each deployment's system analyzes input data streams to determine properties, creates transformation matrices based on these properties, transforms input data into modified statistical distributions comprising dyadic distributions shaped according to transformation matrices, generates main data streams of transformed input data and secondary data streams of transformation information, compresses main data streams using Huffman coding optimized for dyadic distributions, combines compressed main data streams and secondary data streams into output streams, implements security measures to protect output streams, monitors input data streams to detect changes in statistical distribution patterns, generates updated transformation matrices in response to detected changes, and selects and deploys optimal transformation matrices based on performance evaluation criteria. The collaborative learning system enhances this adaptive functionality by enabling knowledge sharing across deployments, reducing time required to achieve optimal performance when novel data distributions are encountered, and improving overall matrix quality through collective intelligence, while maintaining privacy protections that prevent exposure of sensitive information about individual deployments' data characteristics or operational contexts.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

As used herein, "collaborative transformation matrix learning system" refers to a distributed computational system comprising multiple interconnected instances that cooperatively generate, exchange, validate, and optimize transformation matrices used for adaptive data compression and encryption.

As used herein, "adaptive compression and encryption" refers to a process in which a computing system dynamically adjusts mathematical parameters governing both data compression and cryptographic transformation in response to observed changes in data distribution characteristics.

As used herein, "transformation matrix" refers to a mathematical construct comprising numerical coefficients used to map an input data distribution into a modified statistical form, such as a dyadic distribution, to optimize compression efficiency and cryptographic strength.

As used herein, "dyadic distribution" refers to a statistical distribution of symbol probabilities structured such that each probability is represented as a power-of-two fraction, enabling efficient entropy coding using algorithms such as Huffman coding.

As used herein, "distribution profile" refers to a compact numerical representation of the statistical characteristics of observed data distributions, optionally generated through dimensionality reduction and differential privacy mechanisms to prevent reconstruction of underlying data.

As used herein, "differential privacy mechanism" refers to a mathematical process that adds calibrated random noise to statistical outputs to prevent inference of individual data points while maintaining aggregate analytical accuracy.

As used herein, "matrix performance repository" refers to a storage subsystem or database that maintains transformation matrix configurations together with associated distribution profiles, performance metrics, and operational metadata to support similarity-based retrieval and prediction.

As used herein, "performance metrics" refers to quantifiable indicators of transformation matrix performance including, but not limited to, compression efficiency, cryptographic strength, and computational overhead.

As used herein, "trust score" refers to a numerical measure assigned to each participating node within a collaborative network representing the historical reliability, accuracy, and integrity of the node's shared contributions.

As used herein, "trust and validation engine" refers to a subsystem configured to verify mathematical validity, performance accuracy, and reliability of remotely sourced transformation matrices and to adjust associated trust scores based on validation results.

As used herein, "federated matrix constructor" refers to a subsystem configured to integrate collaboratively sourced transformation matrices and locally generated matrices to produce optimized candidate configurations for evaluation and deployment.

As used herein, "network synchronization manager" refers to a subsystem configured to coordinate timing, prioritization, and transmission of collaborative data, including distribution profiles and matrix updates, across nodes within a distributed network.

As used herein, "conflict resolution manager" refers to a subsystem configured to detect and analyze discrepancies between local and shared performance metrics, determine confidence levels for conflicting observations, and implement appropriate response actions including trust adjustments or matrix rejections.

As used herein, "deployment compatibility manager" refers to a subsystem configured to maintain interoperability among heterogeneous system versions by negotiating supported feature sets, translating matrix representation formats, and managing activation of new collaborative capabilities.

As used herein, "performance prediction engine" refers to a subsystem configured to forecast the expected performance of candidate transformation matrices based on similarity analysis and historical data using machine learning or statistical modeling techniques.

As used herein, "collaborative learning coordinator" refers to a supervisory subsystem configured to orchestrate participation of nodes within the collaborative network, maintain registry and trust information, and manage secure communication sessions.

As used herein, "matrix selection controller" refers to a subsystem configured to evaluate multiple candidate transformation matrices using performance predictions, trust metrics, and conflict resolution guidance to determine an optimal matrix for deployment.

As used herein, "privacy-preserving aggregator" refers to a subsystem configured to aggregate distributed learning data and performance metrics using cryptographic and statistical methods, such as secure multi-party computation, homomorphic encryption, and k-anonymity enforcement, without revealing sensitive node-specific information.

As used herein, "matrix validation" refers to the process of verifying that a transformation matrix satisfies required mathematical constraints, such as row-stochastic properties and algorithmic stability, and that its claimed performance metrics align with observed results.

As used herein, "similarity matching" refers to a computational process of comparing distribution profiles using defined distance metrics (for example, Euclidean distance, cosine similarity, or Mahalanobis distance) to identify historical profiles most closely resembling a current profile.

As used herein, "online learning" refers to a machine learning process in which model parameters are continuously updated based on newly observed data or performance outcomes to improve future prediction accuracy.

As used herein, "partition-aware protocol" refers to a communication procedure that maintains partial synchronization among connected subsets of nodes during a network partition and reconciles differences when connectivity is restored.

As used herein, "collaborative knowledge" refers to the aggregated set of validated matrices, distribution profiles, and performance insights shared and refined collectively across multiple deployments in a distributed learning environment.

As used herein, "nontransitory machine-readable storage medium" refers to a physical data storage device, such as a hard drive, solid-state drive, flash memory, or optical disk, that stores computer-executable instructions and data structures that enable implementation of embodiments described herein.

Conceptual Architecture

FIG. 1 is a block diagram illustrating exemplary architecture of a collaborative transformation matrix learning system 100, in an embodiment. System 100 comprises core adaptive system components and collaborative learning components that work together to enable federated matrix optimization across distributed deployments. An input data stream 101 flows into a data distribution analyzer 102, which monitors statistical properties and detects changes in distribution patterns over time. When distribution changes are detected, data distribution analyzer 102 communicates statistical information to a distribution profile generator 115, which creates privacy-preserving representations of the observed distribution characteristics. Distribution profile generator 115 applies dimensionality reduction and differential privacy mechanisms to produce anonymized profiles that can be safely shared across a collaborative network without exposing sensitive information about the underlying data.

The anonymized distribution profiles generated by distribution profile generator 115 are transmitted to a network synchronization manager 145, which coordinates the timing and sequencing of knowledge exchange operations across participating nodes in the collaborative network. Network synchronization manager 145 forwards profiles and matrix configurations to a collaborative learning coordinator 110, which maintains a registry of participating nodes and orchestrates federated learning activities. Collaborative learning coordinator 110 works in conjunction with a privacy-preserving aggregator 130 to combine insights from multiple nodes using secure multi-party computation and homomorphic encryption techniques that allow statistical aggregation without exposing individual node contributions. Privacy-preserving aggregator 130 communicates with remote nodes to exchange distribution profiles, transformation matrices, and performance metrics while maintaining privacy guarantees through k-anonymity enforcement and adaptive privacy budget management.

Transformation matrices received from remote nodes are stored in a matrix performance repository 120, which maintains indexed collections of matrix configurations paired with their associated distribution profiles and performance metrics. Matrix performance repository 120 supports similarity-based retrieval, allowing the system to identify historical matrices that were optimized for distribution patterns resembling current local observations. A performance prediction engine 155 queries matrix performance repository 120 to retrieve relevant historical configurations and applies machine learning models to forecast the likely effectiveness of candidate matrices before committing resources to exhaustive local evaluation. Performance prediction engine 155 provides performance scores to guide subsequent selection decisions, estimating compression efficiency, cryptographic strength, and computational overhead based on similarity between current and historical distribution patterns.

Matrices retrieved from matrix performance repository 120 undergo validation through a trust and validation engine 125, which verifies mathematical properties including row-stochastic constraints and compatibility with dyadic distribution algorithms. Trust and validation engine 125 applies remotely sourced matrices to local test datasets to measure actual performance and compares observed results against claimed metrics provided by contributing nodes. Based on validation outcomes, trust and validation engine 125 assigns and updates trust scores for participating nodes, tracking the historical reliability of their contributions over time. When discrepancies arise between local measurements and shared metrics, a conflict resolution manager 135 investigates potential causes and determines appropriate responses ranging from trust score adjustments to complete rejection of suspect matrices.

A deployment compatibility manager 150 addresses heterogeneity across nodes operating different system versions or configurations by translating matrices between representation formats and negotiating common feature sets. Deployment compatibility manager 150 communicates with network synchronization manager 145 to coordinate version-aware knowledge exchange, maintaining compatibility metadata that prevents integration of matrices that may behave unexpectedly in different system environments. This compatibility management supports backward-compatible operation modes that limit shared insights to configurations all participating versions can safely process.

Validated matrices from trust and validation engine 125, along with locally generated candidates from a dynamic matrix constructor 103, are integrated by a federated matrix constructor 140. Federated matrix constructor 140 generates ensemble candidate sets that combine collaborative insights with local optimization, using transfer learning to extract general principles from successful remote matrices and applying them when generating configurations for novel distribution patterns. The ensemble of candidate matrices produced by federated matrix constructor 140 flows to a matrix selection controller 160, which receives performance predictions from performance prediction engine 155, trust scores from trust and validation engine 125, and conflict resolution guidance from conflict resolution manager 135. Matrix selection controller 160 applies multi-criteria decision algorithms to select an optimal matrix configuration based on comprehensive evaluation across multiple dimensions including predicted performance, source reliability, and consistency with local observations.

The selected matrix is deployed to a transformation matrix generator 104, which provides the configuration to a dyadic distribution module 105 for application to incoming data. Dyadic distribution module 105 transforms the input data according to the deployed matrix, generating a main stream of transformed data and a secondary stream containing transformation information. The transformed main stream flows to a Huffman encoder/decoder 106, which applies compression algorithms optimized for the dyadic distribution properties created by the transformation. Compressed output from Huffman encoder/decoder 106 proceeds to an output stream 199 for transmission or storage. Performance feedback from the deployed matrix flows back through system 100 to conflict resolution manager 135, where actual measured performance is compared against predictions to refine trust scores, update performance models, and inform future matrix selection decisions across the collaborative network.

In various embodiments, the collaborative transformation matrix learning system 100 operates using the same adaptive compression and encryption infrastructure previously described for transformation matrix generation, data transformation, and dyadic distribution processing. The collaborative components shown in FIG. 1 extend this established framework by introducing a federated learning layer that coordinates distributed optimization of transformation matrices across multiple deployments while preserving the underlying compression and encryption architecture. All computational functions described herein are executed by one or more processors operating under software control, using machine-readable instructions stored in nontransitory memory to perform the specific operations of data analysis, matrix generation, validation, and communication. The term "federated learning," as used in this context, refers to a distributed process for optimizing and sharing transformation matrices utilized for adaptive compression and encryption across multiple system deployments, wherein such learning is directed toward improving matrix performance and interoperability rather than performing generalized artificial intelligence model training. The elements depicted in FIG. 1 therefore represent an integrated system in which local adaptive processing and collaborative learning operate together within a unified computational framework, maintaining continuity of the data flow and preserving the security and efficiency properties of the adaptive compression and encryption process.

Figure 2:
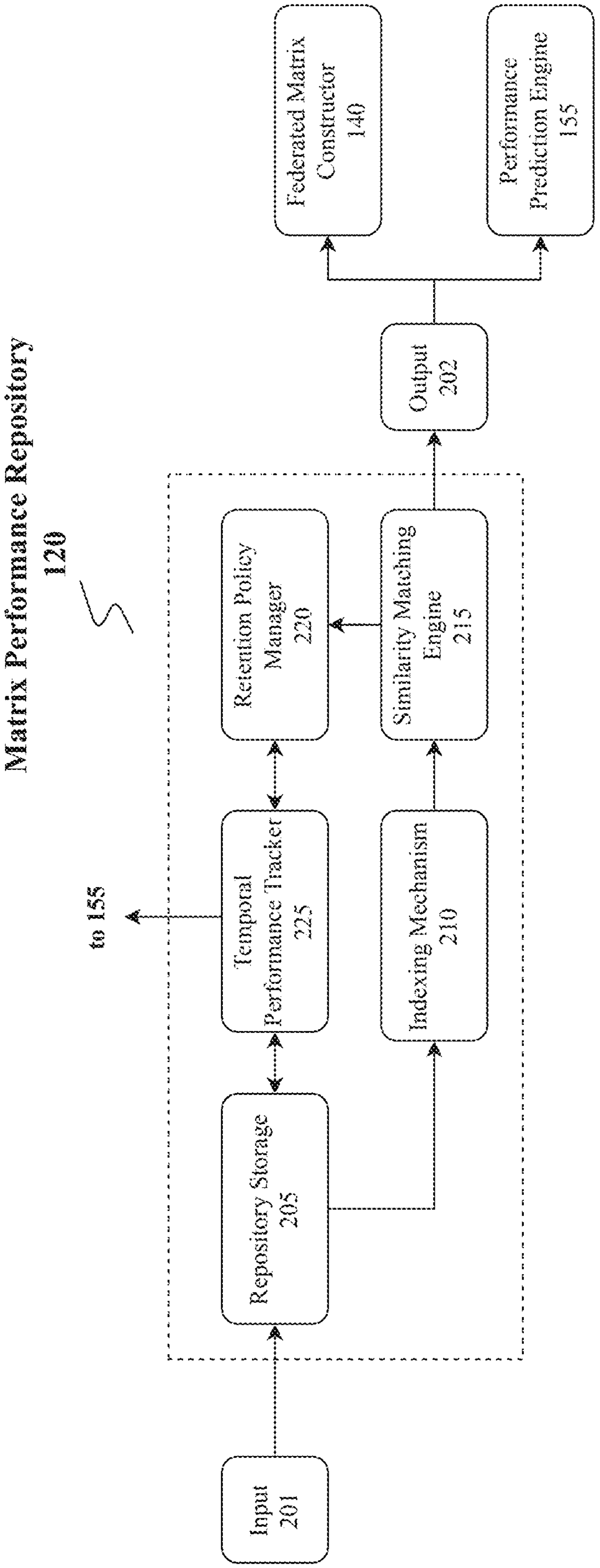
FIG. 2 illustrates an exemplary architecture of a matrix performance repository within the collaborative transformation matrix learning system showing indexed storage of transformation matrices, similarity matching, temporal performance tracking, and retention policy management.

FIG. 2 is a block diagram illustrating an exemplary architecture of a matrix performance repository within a collaborative transformation matrix learning system 100, in an embodiment. An input stream 201 comprising remotely sourced transformation matrices and associated performance metrics flows from participating nodes in a collaborative network into repository storage 205, which maintains indexed collections of matrix configurations paired with corresponding distribution profiles, comprehensive performance metrics covering compression efficiency, cryptographic strength, and computational overhead, and operational metadata describing system versions, configuration modes, and environmental conditions under which performance was measured. Repository storage 205 further maintains temporal tracking data that characterizes how matrix effectiveness evolves over time across diverse data contexts, enabling long-term trend analysis and adaptive retention.

Repository storage 205 communicates with an indexing mechanism 210 that organizes stored matrices according to similarity relationships between their associated distribution profiles, enabling rapid retrieval of historically successful configurations when novel data patterns are encountered. In an embodiment, indexing mechanism 210 applies feature-space embedding and clustering techniques such as k-d trees or locality-sensitive hashing (LSH) to accelerate similarity searches across high-dimensional distribution profile vectors. A similarity matching engine 215 receives queries containing current distribution profiles and computes distance metrics between query profiles and indexed historical profiles using algorithms such as Euclidean distance, cosine similarity, or Mahalanobis distance, applying weighted comparison functions that emphasize statistically significant components of the distribution profile. The similarity matching engine 215 identifies and ranks candidate matrices optimized for similar statistical patterns, generating ranked retrieval lists based on computed similarity scores and confidence levels derived from historical validation density.

A temporal performance tracker 225 receives performance data from repository storage 205 and analyzes how matrix effectiveness changes across extended operational periods, identifying configurations that maintain stable performance and those that degrade as data characteristics drift. Temporal performance tracker 225 computes performance deltas over sliding time windows and employs exponential smoothing to detect performance decay trends, forwarding temporal patterns to a retention policy manager 220 to inform pruning decisions and to a performance prediction engine 155 to improve forecast accuracy.

The retention policy manager 220 monitors storage capacity constraints and implements pruning algorithms that selectively remove redundant or consistently underperforming matrix configurations while preserving matrices with broad applicability, exceptional performance, or coverage of rarely encountered distribution types. In an embodiment, pruning decisions are guided by composite utility scores derived from a weighted combination of performance stability, coverage frequency, and cross-node validation counts. Decisions from the retention policy manager 220 flow back to repository storage 205 to maintain optimal repository composition and data integrity.

Performance prediction engine 155 applies machine learning models trained on historical performance data to interpolate or extrapolate expected results for retrieved matrices under current local conditions, estimating likely compression efficiency, cryptographic strength, and computational cost based on degree of similarity between observed and historical distribution patterns. The performance prediction engine 155 implements regression and ensemble learning models, such as gradient-boosted trees or neural-network predictors, trained to forecast multi-metric performance outcomes with quantified confidence intervals.

Query results comprising candidate matrices, ranked similarity metrics, and associated performance predictions flow through an output stream 202 to a federated matrix constructor 140 and to the performance prediction engine 155 to support matrix selection decisions within the collaborative transformation matrix learning system 100. By maintaining a temporally adaptive, similarity-indexed repository of validated matrix configurations, the architecture illustrated in FIG. 2 enables distributed deployments to identify effective transformation matrices rapidly and accurately, thereby reducing redundant optimization effort, mitigating cold-start inefficiencies, and improving convergence speed and consistency of adaptive compression and encryption performance across the collaborative network.

Figure 3:
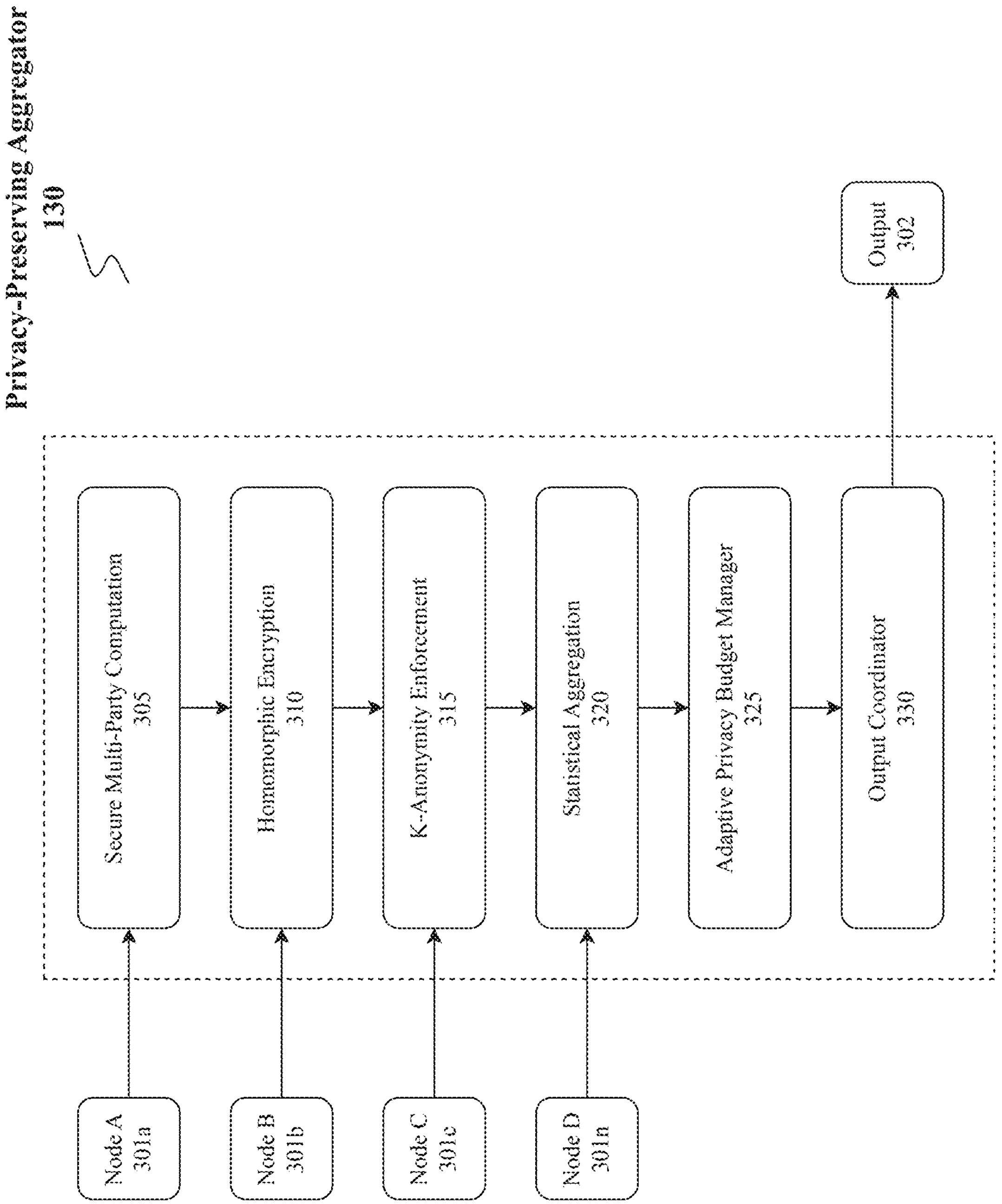
FIG. 3 illustrates an exemplary architecture of a privacy-preserving aggregator showing secure multi-party computation, homomorphic encryption processing, k-anonymity enforcement, statistical aggregation, adaptive privacy-budget management, and coordinated output distribution.

FIG. 3 is a block diagram illustrating an exemplary architecture of a privacy-preserving aggregator 130 within a collaborative transformation matrix learning system 100, in an embodiment. Input streams 301*a,b,c-n* comprising distribution profiles, performance metrics, matrix configurations, and encrypted data flow from participating nodes in a collaborative network into a secure multi-party computation (SMPC) engine 305, which implements cryptographic protocols such as Shamir secret sharing, additive secret sharing, or garbled-circuit-based protocols that allow multiple nodes to jointly compute aggregate statistics over their combined observations while preventing disclosure of any individual node's data. The secure multi-party computation engine 305 communicates processed intermediate results to a homomorphic-encryption processor 310, which receives encrypted performance metrics from nodes and applies mathematical operations such as addition or weighted averaging directly to ciphertext values using fully or partially homomorphic encryption schemes (for example, Paillier or CKKS), enabling comparison and combination of encrypted metrics without decryption. This cryptographic computation supports identification of superior transformation matrix configurations while ensuring that the individual performance characteristics of contributing nodes remain confidential.

Output from the homomorphic-encryption processor 310 flows to a k-anonymity enforcement engine 315, which verifies that shared distribution profiles correspond to observations from at least a threshold number k of distinct nodes before permitting release. The engine 315 implements profile-matching algorithms that cluster statistically similar profiles and enforce anonymity constraints that mitigate risks of fingerprinting or re-identification of specific nodes within the collaborative network.

The k-anonymity enforcement engine 315 transmits validated aggregated data to a statistical aggregation processor 320, which applies robust statistical methods including median-based aggregation, trimmed-mean computation, and outlier detection techniques to combine metrics across multiple nodes while reducing the influence of anomalous or potentially malicious contributions. Results from the statistical aggregation processor 320 flow to an adaptive privacy-budget manager 325, computes and applies adaptive parameters that balance privacy protection and utility of shared insights by dynamically adjusting differential-privacy parameters. The manager 325 allows each node to configure its own privacy sensitivity settings according to operational context, and automatically calibrates the magnitude of noise injection and aggregation thresholds based on current privacy-budget allocations and the observed variability of encrypted performance metrics.

The adaptive privacy-budget manager 325 communicates finalized aggregated statistics to an output coordinator 330, which assembles privacy-preserved collective insights into standardized transmission packages and manages their distribution across the collaborative network. The output coordinator 330 transmits aggregated outputs 302 comprising anonymized performance trends, validated transformation-matrix performance patterns, and statistical summaries that participating nodes can utilize to refine local optimization of transformation matrices for adaptive compression and encryption. Throughout this process, end-to-end cryptographic protection and privacy enforcement are maintained, ensuring that the collaborative learning system accelerates convergence toward optimal matrix configurations while preserving confidentiality of node-specific data. Feedback mechanisms from receiving nodes update privacy-budget parameters based on measured utility of the aggregated insights, closing a continuous adaptation loop that balances information value and privacy protection across distributed deployments.

Figure 4:
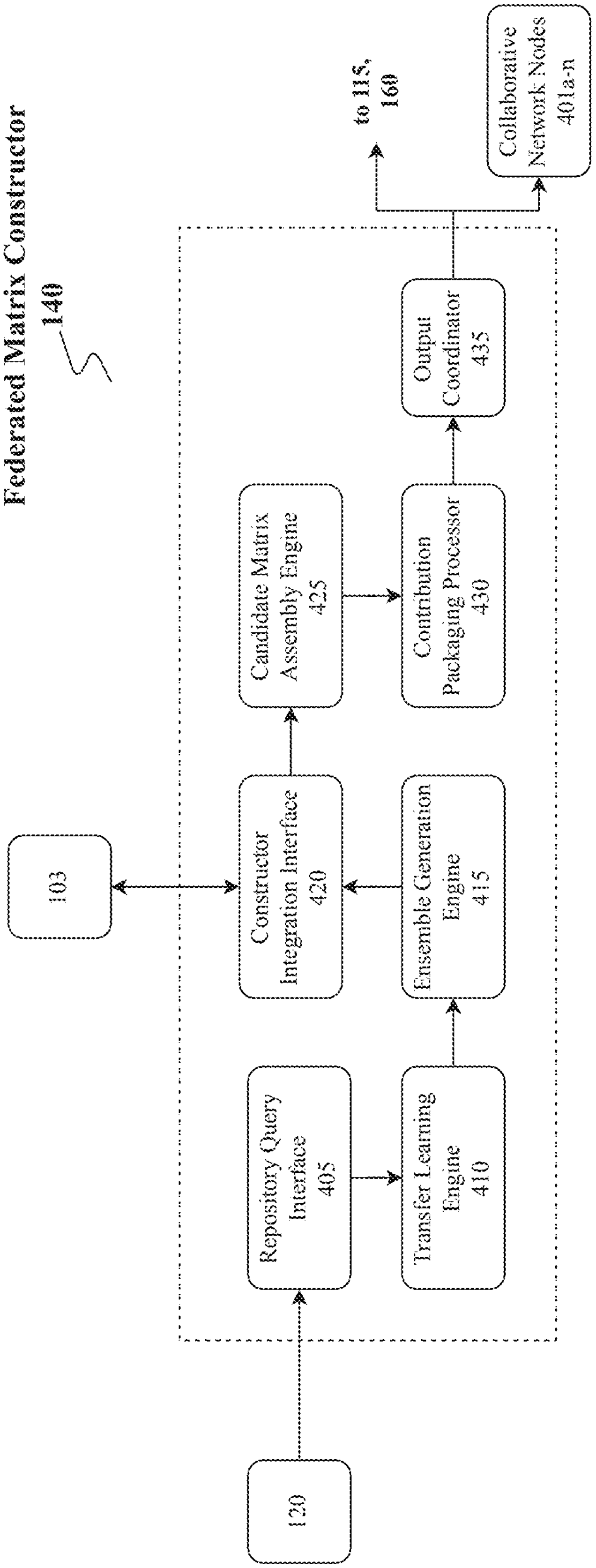
FIG. 4 illustrates an exemplary architecture of a federated matrix constructor showing repository querying, transfer learning, ensemble generation, integration of collaborative and local candidates, and packaging of effective matrices for contribution to the network.

FIG. 4 is a block diagram illustrating an exemplary architecture of a federated matrix constructor 140 within a collaborative transformation matrix learning system 100, in an embodiment.

A repository query interface 405 receives queries for historical matrix configurations from a matrix performance repository 120, implementing similarity-based search algorithms that identify previously validated matrices optimized for distribution patterns resembling current local observations, with retrieved configurations flowing to a transfer-learning engine 410. The transfer-learning engine 410 analyzes structural patterns in successful matrices across different distribution types, extracting general optimization principles and identifying mathematical relationships between distribution characteristics and effective matrix properties that can be applied when generating matrices for novel distributions not yet covered by collaborative knowledge. In an embodiment, transfer-learning engine 410 may employ feature-space regression, parameter mapping using neural-network fine-tuning, or gradient-based adaptation techniques that repurpose weights or coefficients from existing transformation matrices to initialize optimization for unseen distributions. Output from transfer-learning engine 410 flows to an ensemble generation engine 415, which creates multiple candidate matrices drawing from three distinct sources including collaborative matrices adapted from repository retrievals, locally optimized matrices generated without reference to shared knowledge, and hybrid candidates that blend insights from both collaborative and local optimization approaches.

The ensemble generation engine 415 communicates generated candidates to a local constructor integration interface 420, which receives locally generated candidate matrices from a dynamic matrix constructor 103 and combines them with collaboratively sourced candidates to create a comprehensive ensemble representing diverse optimization strategies. The local constructor integration interface 420 transmits the combined candidate set to a candidate-matrix assembly engine 425, which packages the ensemble with metadata annotations describing the source and derivation of each candidate matrix, performance predictions based on similarity matching, and compatibility information relevant to deployment decisions. Output from candidate-matrix assembly engine 425 flows to a contribution packaging processor 430, which identifies particularly effective matrix configurations generated through local innovation that may benefit other nodes in the collaborative network, preparing these matrices with associated performance metrics and distribution-profile identifiers for sharing. The contribution packaging processor 430 communicates prepared contributions to an output coordination engine 435, which manages bidirectional data flow by transmitting the candidate ensemble to a performance prediction engine 155 and a matrix selection controller 160 for analytical scoring and selection decisions while simultaneously distributing successful locally generated matrices to collaborative network nodes 401*a-n*. This coordinated output supports continuous knowledge exchange that improves matrix quality, accelerates convergence to optimal configurations, and enhances overall compression-encryption performance across the distributed deployment environment.

Figure 5:
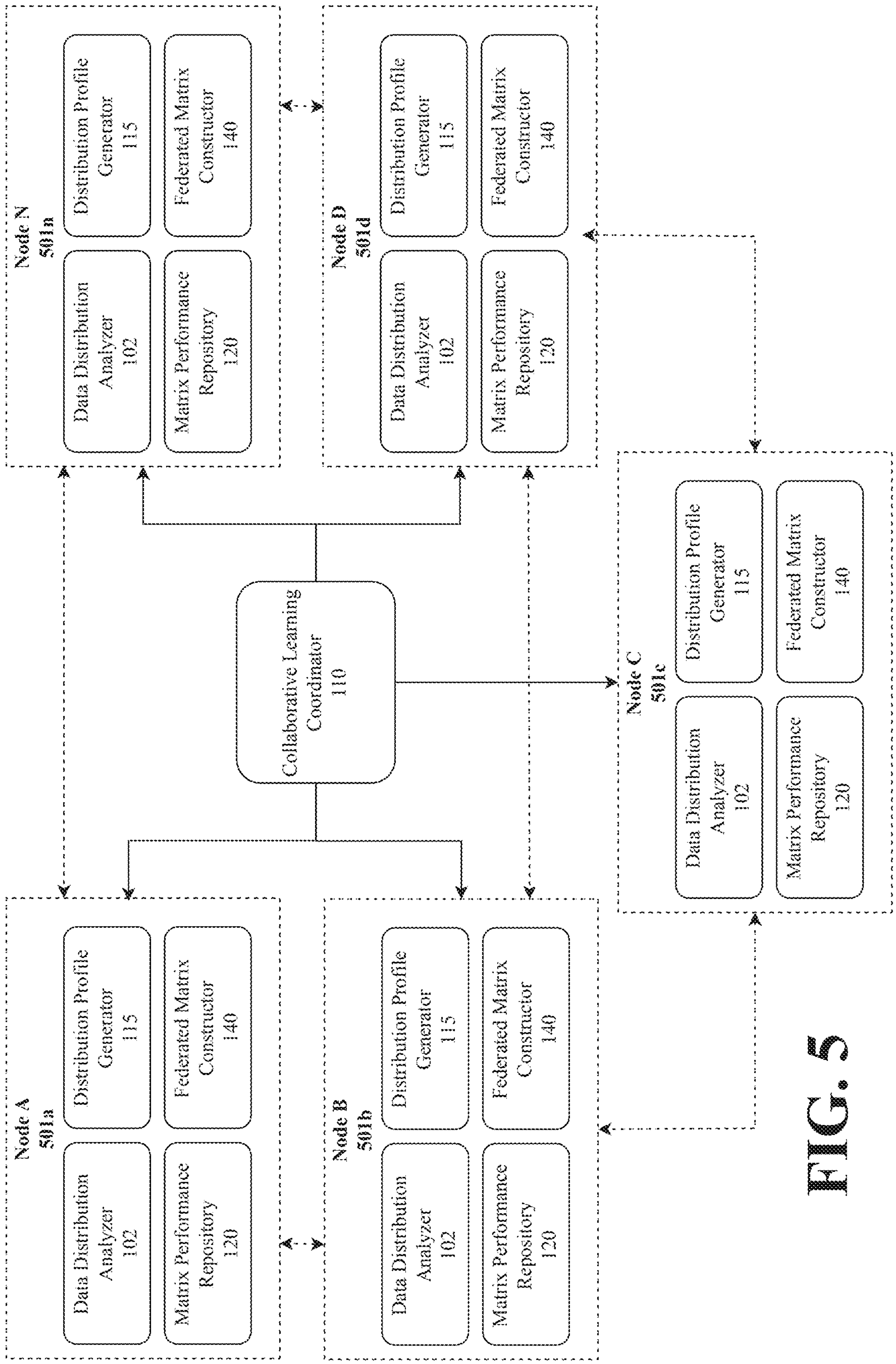
FIG. 5 illustrates an exemplary multi-node network architecture within the collaborative transformation matrix learning system showing interactions among participating nodes, secure communication channels, the collaborative learning coordinator, and repository synchronization across the network.

FIG. 5 is a block diagram illustrating an exemplary multi-node network architecture within a collaborative transformation matrix learning system 100, in an embodiment. A collaborative learning coordinator 110 maintains network orchestration, session management, and trust-management functions for participating nodes 501*a-n* distributed across a collaborative network, with the coordinator implementing authenticated session-establishment protocols that create secure communication channels to each participating node. Each channel may employ authenticated encryption standards such as Transport Layer Security (TLS 1.3) or post-quantum key-exchange mechanisms such as Kyber or NTRU to ensure confidentiality, integrity, and forward secrecy of transmitted data. The collaborative learning coordinator 110 maintains a registry of participating nodes and continuously tracks operational status, contribution history, and trust scores that quantify the historical reliability of shared matrices and metrics.

Each node 501*a-n* may comprise a data-distribution analyzer 102 that monitors statistical characteristics of local input data streams, a distribution-profile generator 115 that creates anonymized representations of observed distribution patterns using differential-privacy techniques, a matrix-performance repository 120 that stores validated transformation matrices and associated performance metrics, and a federated matrix constructor 140 that integrates collaboratively sourced insights with local optimization processes. The collaborative learning coordinator 110 communicates with node 501*a* through its secure channel, supporting transmission of anonymized distribution profiles, transformation-matrix configurations, and performance metrics while maintaining privacy protections through encryption and identity-verification mechanisms. The coordinator updates trust scores for each participating node 501*a-n* based on validation results of previously received matrices and accuracy of reported metrics.

Node 501*a* exchanges matrix configurations and performance data directly with node 501*b* through peer-to-peer communication channels that operate independently of the coordinator, supporting direct knowledge sharing between nodes processing similar data-distribution types. Such peer-to-peer exchanges may employ decentralized authentication or mutual certificate-based verification to ensure message integrity without centralized oversight. Node 501*c* maintains trust relationships with multiple other nodes in the network, including node 501*a*, with trust scores influencing acceptance decisions for remotely sourced matrices and weighting of contributed insights during aggregation operations executed by the privacy-preserving aggregator 130. The collaborative learning coordinator 110 coordinates repository-synchronization activities across nodes 501*a-n*, implementing version-control and consensus protocols that propagate validated matrix configurations and aggregated performance statistics throughout the network while managing version compatibility and preventing conflicts during concurrent updates.

Node 501*d* shares anonymized distribution profiles with node 501*e*, with the receiving node querying its local matrix-performance repository 120 to identify relevant historical matrices and using its federated matrix constructor 140 to integrate collaborative insights into candidate-generation processes. Communication channels between the collaborative learning coordinator 110 and nodes 501*a-n* support fully bidirectional data flow, enabling nodes to transmit locally learned insights, performance metrics, and newly validated matrices to the coordinator for potential redistribution to other participants while receiving aggregated knowledge, trust-weighted updates, and validated matrix configurations from the broader network. Through these coordinated and peer-to-peer exchanges, the collaborative transformation matrix learning system 100 establishes a federated learning architecture that accelerates adaptation across distributed deployments, enhances convergence toward optimal transformation matrices, and improves overall compression-encryption efficiency while maintaining strict privacy and security guarantees for all participating nodes.

Figure 6:
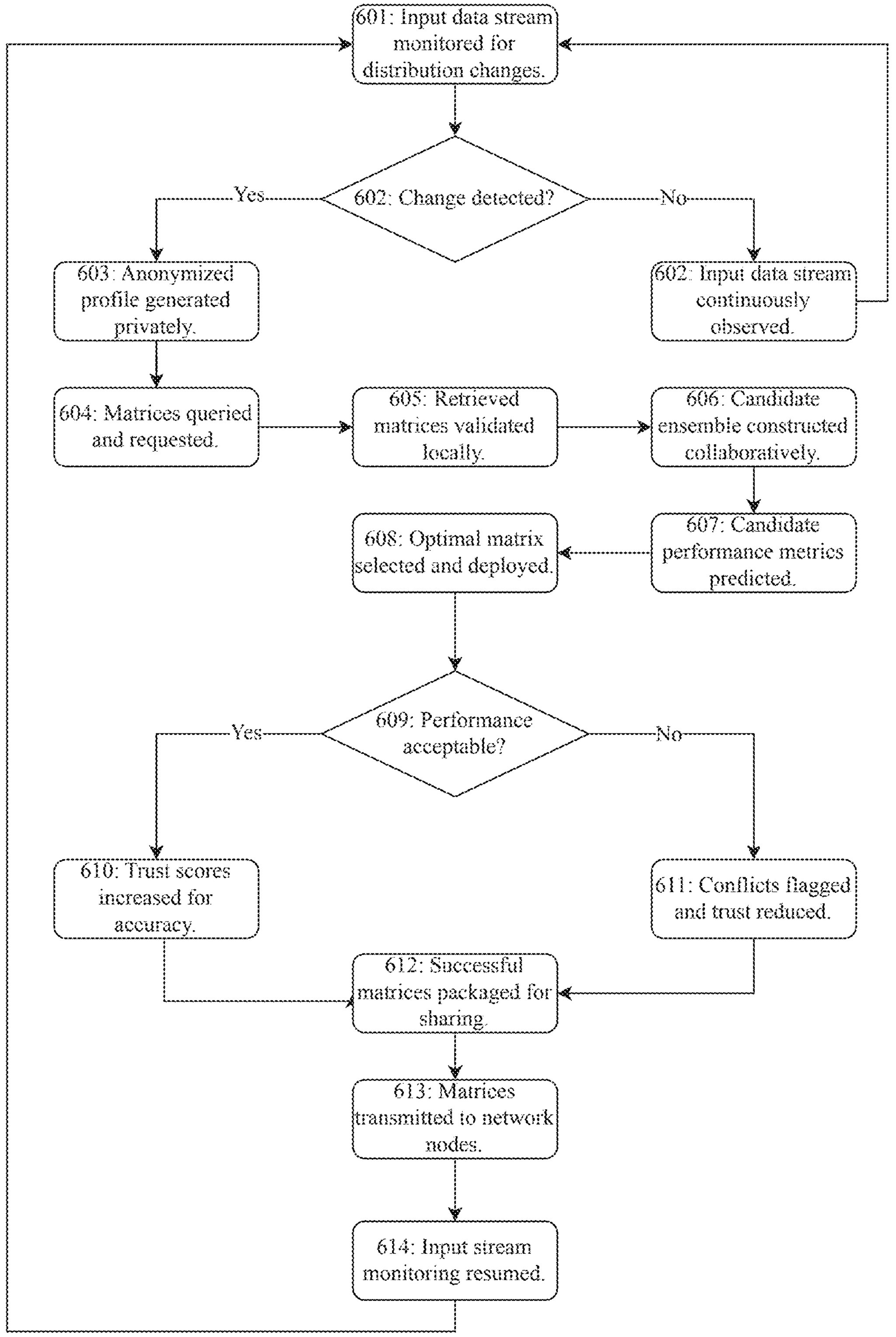
FIG. 6 illustrates an exemplary collaborative learning process flow showing detection of distribution changes, generation and sharing of anonymized distribution profiles, validation of received matrices, integration of collaborative and local candidates, selection and deployment of an optimal matrix, and feedback updates for continuous learning.

FIG. 6 is a flow diagram illustrating an exemplary collaborative learning process of a collaborative transformation matrix learning system 100, in an embodiment. A data-distribution analyzer 102 monitors an input data stream to detect changes in statistical distribution patterns of incoming data 601. When no distribution change is detected, the system continues monitoring the input data stream 602. When a distribution change is detected, a distribution-profile generator 115 creates an anonymized distribution profile representing characteristics of the observed distribution using differential-privacy mechanisms 603.

A matrix-performance repository 120 queries local storage and a network-synchronization manager 145 requests relevant matrices from participating nodes in the collaborative network based on similarity to the current distribution profile 604. A trust-and-validation engine 125 validates retrieved matrices by verifying mathematical properties and comparing claimed performance against locally generated test datasets 605. A federated matrix constructor 140 integrates validated remotely sourced matrices with locally generated candidates from a dynamic matrix constructor 103 to create a comprehensive candidate ensemble 606.

A performance prediction engine 155 analyzes candidate matrices in the ensemble to forecast expected compression efficiency, cryptographic strength, and computational overhead 607. The engine may apply regression models, neural-network predictors, or ensemble-learning techniques trained on historical performance data to generate quantitative predictions for each candidate configuration. A matrix-selection controller 160 receives the predicted performance metrics and selects and deploys an optimal transformation matrix to a transformation-matrix generator 104 based on performance evaluation criteria, trust scores, and compatibility constraints 608.

The system monitors actual performance of the deployed matrix during operation through a dyadic-distribution module 105 and compares observed results against predicted performance metrics 609. When performance is acceptable, the trust-and-validation engine 125 updates trust scores positively for nodes that contributed matrices or insights 610. When performance is not acceptable, a conflict-resolution manager 135 adjusts trust scores downward and flags the discrepancy for investigation 611. The federated matrix constructor 140 identifies successful matrix configurations and packages them with associated metadata and distribution-profile identifiers for sharing 612. A network-synchronization manager 145 transmits the successful matrix configuration to participating nodes through secure communication channels 613. The data-distribution analyzer 102 resumes monitoring the input data stream for subsequent distribution changes 614, maintaining continuous adaptation through the collaborative learning cycle.

Figure 7:
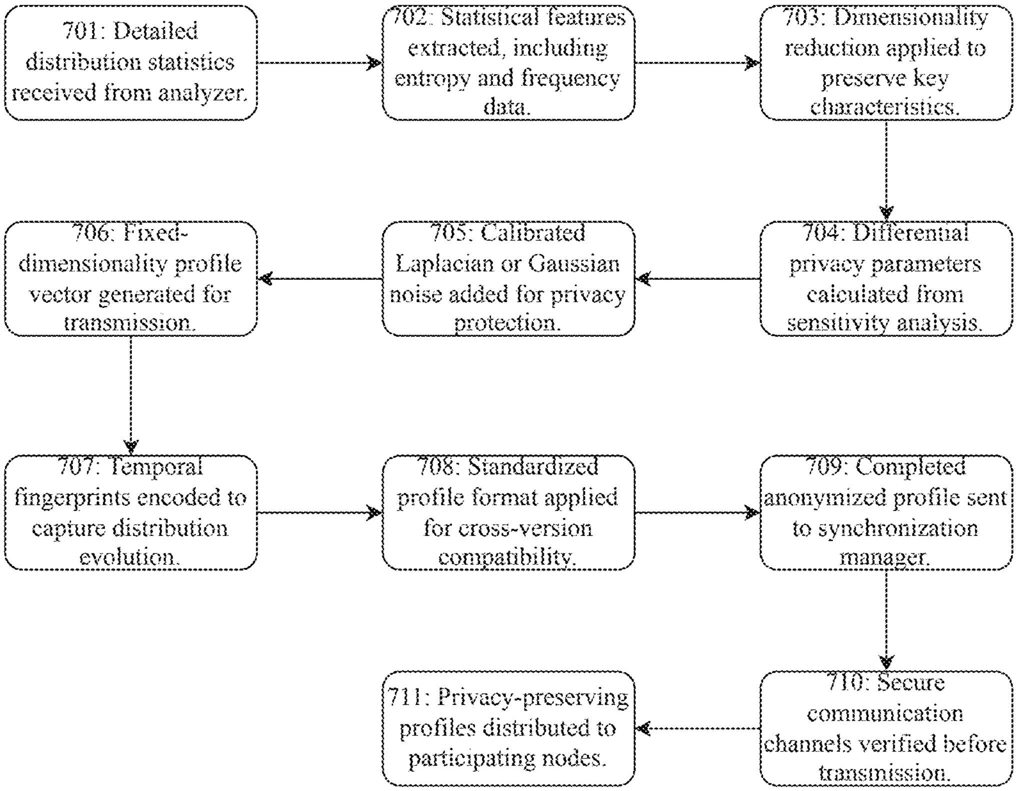
FIG. 7 illustrates an exemplary distribution-profile generation and sharing process showing extraction of statistical features, application of dimensionality reduction and differential privacy noise, creation of standardized profile vectors, and transmission of profiles to other network nodes via secure communication channels.

FIG. 7 is a flow diagram illustrating an exemplary distribution-profile generation and sharing process within a collaborative transformation matrix learning system 100, in an embodiment. A distribution-profile generator 115 receives detailed distribution statistics from a data-distribution analyzer 102 that has monitored local input-data streams 701. The distribution-profile generator 115 extracts statistical features including entropy measures, moment statistics, frequency-domain representations, and autocorrelation patterns from the received distribution data 702. The distribution-profile generator 115 applies dimensionality-reduction techniques such as principal-component analysis or autoencoder compression to reduce the feature space while preserving essential distribution characteristics 703.

A privacy-parameter calculator within the distribution-profile generator 115 determines differential-privacy noise parameters based on sensitivity analysis and configured privacy-budget allocations 704. The distribution-profile generator 115 adds calibrated noise to the distribution statistics according to the calculated privacy parameters to prevent reconstruction of individual data points 705. The calibrated noise may be applied using Laplacian or Gaussian differential-privacy mechanisms chosen according to the statistical sensitivity of the features being protected.

The distribution-profile generator 115 creates a fixed-dimensionality profile vector that captures essential distribution characteristics in a compact representation suitable for network transmission 706. The distribution-profile generator 115 encodes temporal fingerprints that characterize how the distribution evolves over time, enabling recognition of similar shift patterns across deployments 707. The distribution-profile generator 115 applies a standardized profile format that remains consistent across different system deployments and versions to ensure interoperability 708. The distribution-profile generator 115 transmits the completed anonymized distribution profile to a network-synchronization manager 145 for coordination of knowledge-exchange operations 709. The network-synchronization manager 145 verifies availability of secure communication channels to participating nodes before initiating transmission 710. The network-synchronization manager 145 distributes the privacy-preserving distribution profile to participating nodes in the collaborative network through established secure channels 711, enabling collective adaptation while maintaining privacy guarantees for locally observed data distributions.

Figure 8:
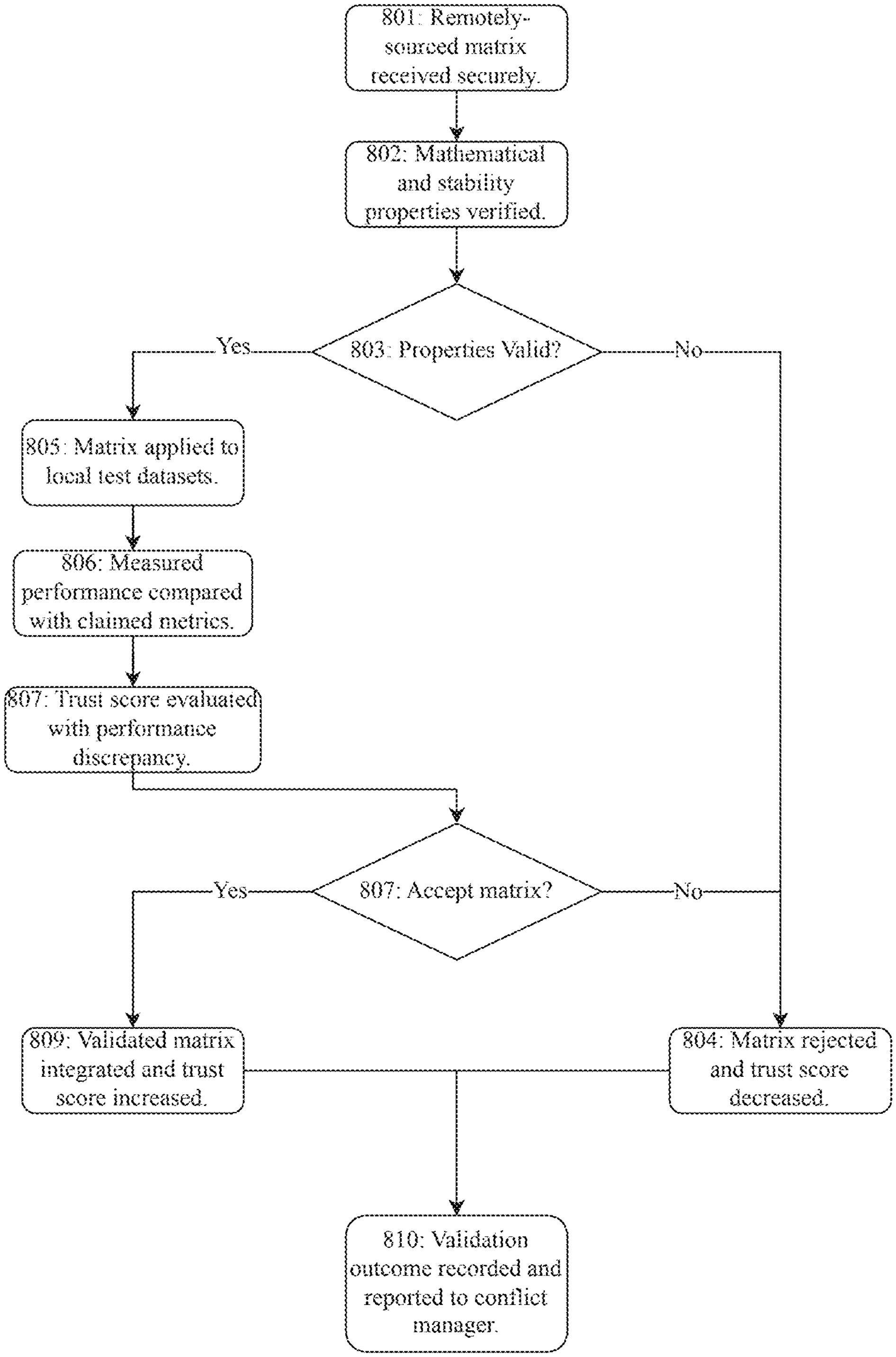
FIG. 8 illustrates an exemplary matrix validation process flow showing receipt of a remotely sourced matrix, verification of mathematical properties, application to test datasets, comparison of actual and claimed performance, trust-score evaluation, acceptance or rejection, and audit logging of validation results.

FIG. 8 is a flow diagram illustrating exemplary matrix validation within a collaborative transformation matrix learning system 100, in an embodiment. A trust and validation engine 125 receives a remotely-sourced transformation matrix from at least one remote node in the collaborative network via secure communication channels established by a network synchronization manager 145, initiating the validation process 801. The trust and validation engine 125 verifies that the received matrix maintains row-stochastic properties required by the dyadic distribution algorithm and satisfies numerical stability constraints across expected ranges of input values, such as by verifying eigenvalue magnitudes or condition numbers within defined tolerances 802. The trust and validation engine 125 determines compliance of the mathematical properties with predefined verification criteria 803.

When the matrix fails to meet the verification criteria, the trust and validation engine 125 rejects the matrix and decreases the trust score associated with the contributing node to reflect the failed validation 804. When the matrix satisfies the verification criteria, the trust and validation engine 125 applies the remotely-sourced matrix to local test datasets and measures actual performance including compression efficiency and cryptographic strength under controlled conditions 805.

The trust and validation engine 125 compares the measured actual performance against performance metrics claimed by the contributing node that were transmitted alongside the matrix configuration 806. The trust and validation engine 125 evaluates the trust score previously assigned to the contributing node in conjunction with the degree of match or discrepancy between actual measured performance and claimed performance metrics 807. The trust and validation engine 125 determines whether to accept the matrix for integration into local matrix selection processes based on combined evaluation of trust score threshold satisfaction and performance adequacy 808.

When the acceptance decision is affirmative, the trust and validation engine 125 integrates the validated matrix into the matrix performance repository 120 and increases the trust score associated with the contributing node based on successful validation 809. When the acceptance decision is negative, the trust and validation engine 125 rejects the matrix and applies the trust score update from step 804. The validation process concludes with the matrix either accepted for local use or rejected with appropriate trust score adjustments recorded in audit logs maintained by the trust and validation engine 125, and validation outcomes communicated to a conflict resolution manager 135 for consistency monitoring across the collaborative network 810.

Figure 9:
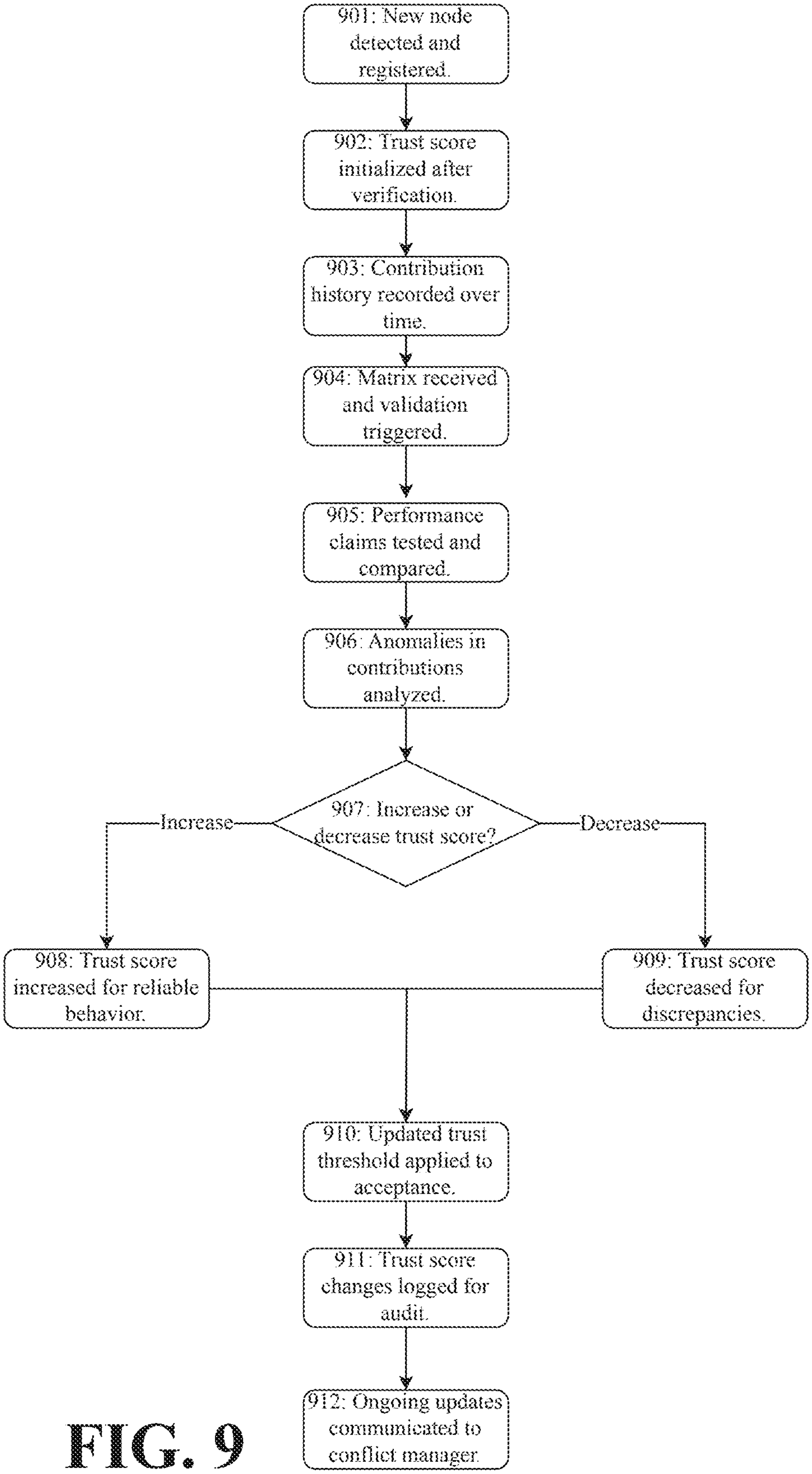
FIG. 9 illustrates an exemplary trust-score management process flow showing initialization of trust scores for new nodes, validation of shared matrices, anomaly detection, trust adjustment, and maintenance of audit logs reflecting contribution reliability over time.

FIG. 9 is a flow diagram illustrating exemplary trust score management within a collaborative transformation matrix learning system 100, in an embodiment. A collaborative learning coordinator 110 detects that a new node has joined the collaborative network through session establishment protocols and initiates trust score management for the newly participating node 901. A trust and validation engine 125 initializes a trust score for the new node based on cryptographic identity verification and optional organizational credentials provided during network registration 902. The trust and validation engine 125 records contribution history over time by logging each matrix configuration, distribution profile, and performance metric shared by the node along with timestamps and metadata describing the contributions 903. The trust and validation engine 125 receives a matrix configuration from the node via secure communication channels managed by a network synchronization manager 145, triggering validation procedures for the contributed matrix 904. The trust and validation engine 125 validates performance claims associated with the shared matrix by applying the matrix to standardized test datasets and comparing actual measured performance against claimed metrics provided by the contributing node 905. The trust and validation engine 125 detects anomalies in contribution patterns by analyzing the node's historical contributions for behaviors such as consistently sharing underperforming matrices, contribution patterns correlating with known attack signatures, or sudden quality degradation 906. The trust and validation engine 125 evaluates whether detected anomalies indicate potential reliability concerns or adversarial behavior requiring trust score adjustment 907. When actual performance matches or exceeds claimed metrics and no anomalies are detected, the trust and validation engine 125 increases the trust score to reflect successful validation and reliable contribution behavior 908. When significant discrepancies are identified between actual and claimed performance or when anomalies are detected in contribution patterns, the trust and validation engine 125 decreases the trust score to reflect reduced confidence in the contributing node's reliability 909. The trust and validation engine 125 uses the updated trust threshold in matrix acceptance decisions, determining whether matrices from the node meet minimum trust requirements for integration into local matrix selection processes 910. The trust and validation engine 125 maintains an audit log of trust score changes including timestamps, validation results, anomaly detection outcomes, and the magnitude and direction of each adjustment to provide transparency and enable forensic analysis 911. The trust score management process continues iteratively as the node makes additional contributions to the collaborative network, with the trust score evolving based on demonstrated reliability over time and results communicated to a conflict resolution manager 135 for inclusion in subsequent discrepancy analysis 912.

Figure 10:
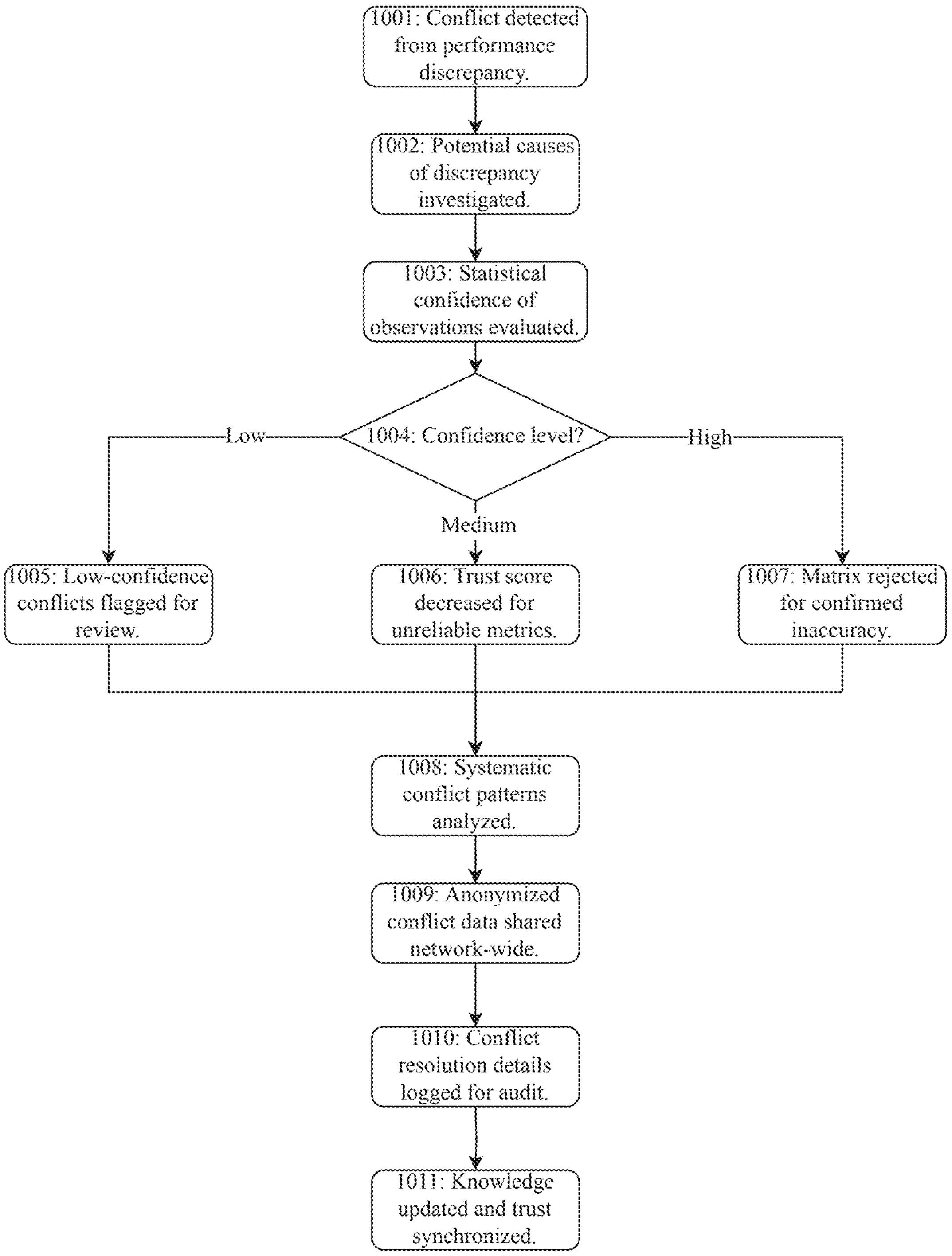
FIG. 10 illustrates an exemplary conflict-resolution process flow showing detection of discrepancies between local and shared metrics, analysis of potential causes, confidence-level assessment, graduated response actions, feedback to the collaborative network, and synchronization of trust updates.

FIG. 10 is a flow diagram illustrating exemplary conflict resolution within a collaborative transformation matrix learning system 100, in an embodiment. A conflict resolution manager 135 detects a conflict when local performance measurements for a deployed matrix differ significantly from performance metrics shared by a contributing node alongside the matrix configuration 1001. The conflict resolution manager 135 investigates potential causes of the discrepancy including environmental differences between deployments such as hardware configurations or network conditions, version incompatibilities between system software, variations in measurement methodology used to calculate performance metrics, or genuine performance variability across different data contexts 1002. The conflict resolution manager 135 evaluates the statistical confidence of local observations versus shared observations by analyzing sample sizes, measurement consistency, and alignment with historical performance patterns observed in a matrix performance repository 120 1003. The conflict resolution manager 135 assesses confidence in the conflict determination to guide the appropriate response based on the strength of evidence supporting local measurements versus shared metrics 1004. When confidence level is assessed as low indicating ambiguity about which measurements are more reliable, the conflict resolution manager 135 flags the discrepancy for human review by system administrators or operators who can provide additional context 1005. When confidence level is assessed as medium indicating reasonable evidence of unreliable shared metrics, the conflict resolution manager 135 decreases the trust score of the contributing node to reflect reduced confidence in future contributions from that source 1006. When confidence level is assessed as high indicating strong evidence that shared metrics are inaccurate or the matrix performs poorly in the local environment, the conflict resolution manager 135 rejects the matrix completely and removes it from local consideration 1007. The conflict resolution manager 135 identifies systematic patterns in conflicts by analyzing historical conflict data to detect whether certain matrices perform poorly in specific operational modes, whether particular distribution types yield unreliable collaborative insights, or whether specific contributing nodes exhibit consistent measurement discrepancies 1008. The conflict resolution manager 135 provides feedback to a collaborative network through a network synchronization manager 145, sharing anonymized conflict data to improve collective knowledge about matrix performance boundaries and reliability patterns 1009. The conflict resolution manager 135 logs each conflict resolution decision including detected discrepancy magnitude, investigated causes, confidence assessment, chosen response action, and any identified patterns in an audit trail maintained for transparency and forensic analysis 1010. The conflict resolution process concludes with updated knowledge that refines future acceptance criteria, synchronizes trust adjustments with a trust and validation engine 125, and improves the quality of collaborative learning across the distributed network 1011.

Figure 11:
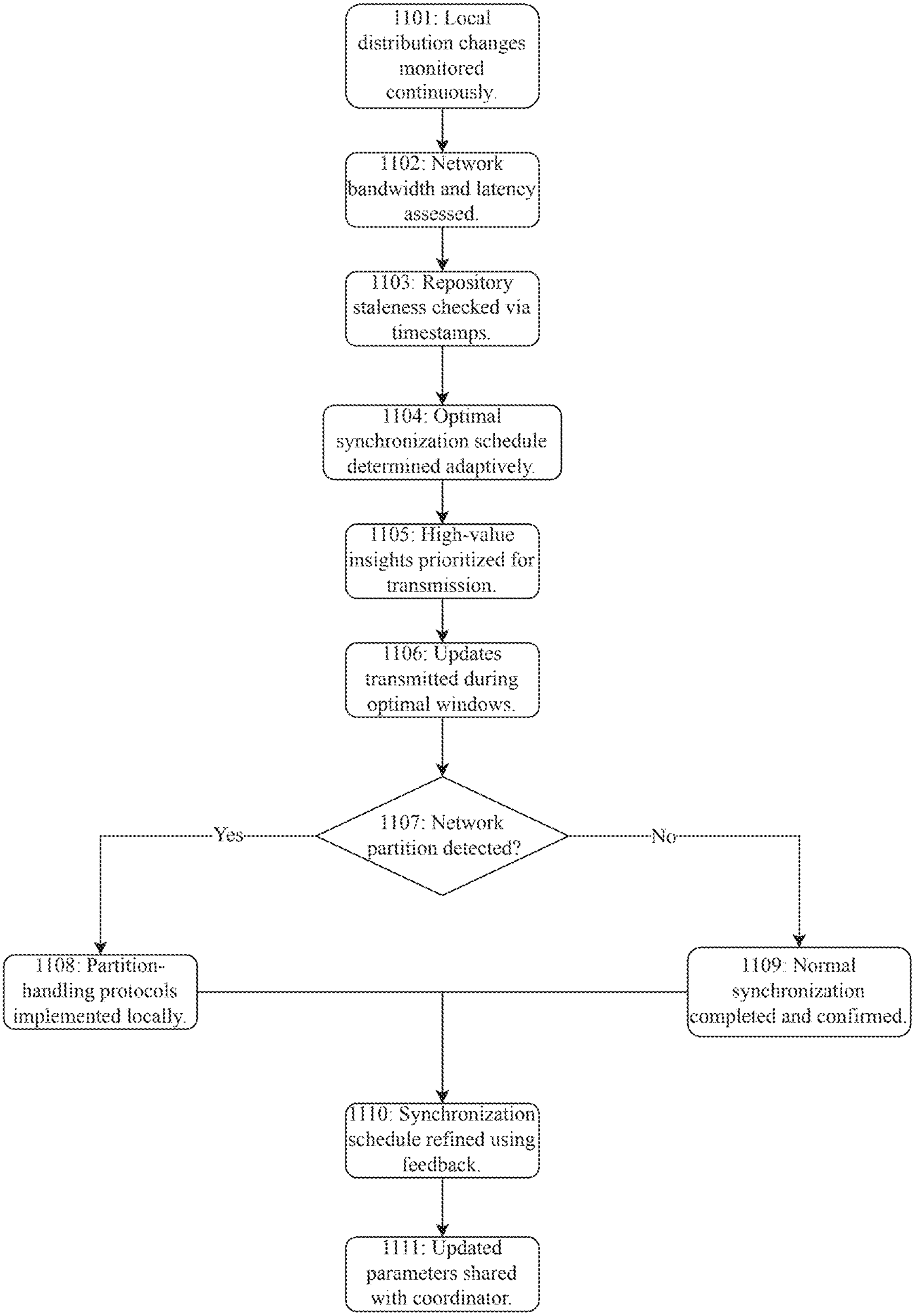
FIG. 11 illustrates an exemplary network synchronization process flow showing monitoring of distribution changes, assessment of bandwidth and repository staleness, scheduling of synchronization intervals, handling of network partitions, and refinement of synchronization parameters for future cycles.

FIG. 11 is a flow diagram illustrating exemplary network synchronization within a collaborative transformation matrix learning system 100, in an embodiment. A network synchronization manager 145 monitors local distribution changes detected by a data distribution analyzer 102 and calculates distribution-shift rates to determine appropriate synchronization frequency 1101. The network synchronization manager 145 assesses network bandwidth availability by measuring current throughput, latency, and congestion levels on communication channels connecting the local node to other participating nodes in the collaborative network 1102. The network synchronization manager 145 checks staleness of information in a local matrix performance repository 120 by comparing timestamps of stored matrices and performance metrics against current time to identify when collaborative knowledge has become outdated 1103. The network synchronization manager 145 determines an optimal synchronization schedule based on combined evaluation of distribution-change rates, network bandwidth availability, and repository staleness, adjusting the frequency and timing of knowledge exchange operations accordingly 1104. The network synchronization manager 145 prioritizes high-value insights for transmission by identifying matrices for novel distribution types, configurations with exceptional performance characteristics, or critical security-related updates that should be propagated before lower-priority information 1105. The network synchronization manager 145 schedules update transmissions during optimal windows to avoid periods of peak network utilization or high local computational load while ensuring timely propagation of valuable insights 1106. The network synchronization manager 145 evaluates whether a network partition has been detected that isolates subsets of nodes and prevents communication across the full collaborative network 1107. When a network partition is detected, the network synchronization manager 145 handles the condition by implementing partition-aware protocols that maintain local collaboration within connected subgroups and prepare reconciliation procedures for when connectivity is restored 1108. When no network partition is detected, the network synchronization manager 145 completes normal synchronization by finalizing transmission of prioritized updates and confirming successful receipt by target nodes in the collaborative network 1109. The network synchronization manager 145 updates the synchronization schedule based on outcomes of the current synchronization cycle, refining future timing and prioritization decisions using feedback about transmission success, network conditions, and the value of exchanged insights 1110. The network synchronization process concludes with updated scheduling parameters that govern subsequent knowledge exchange operations across the distributed deployment environment, with synchronization status shared with a collaborative learning coordinator 110 to maintain network-wide awareness 1111.

Figure 12:
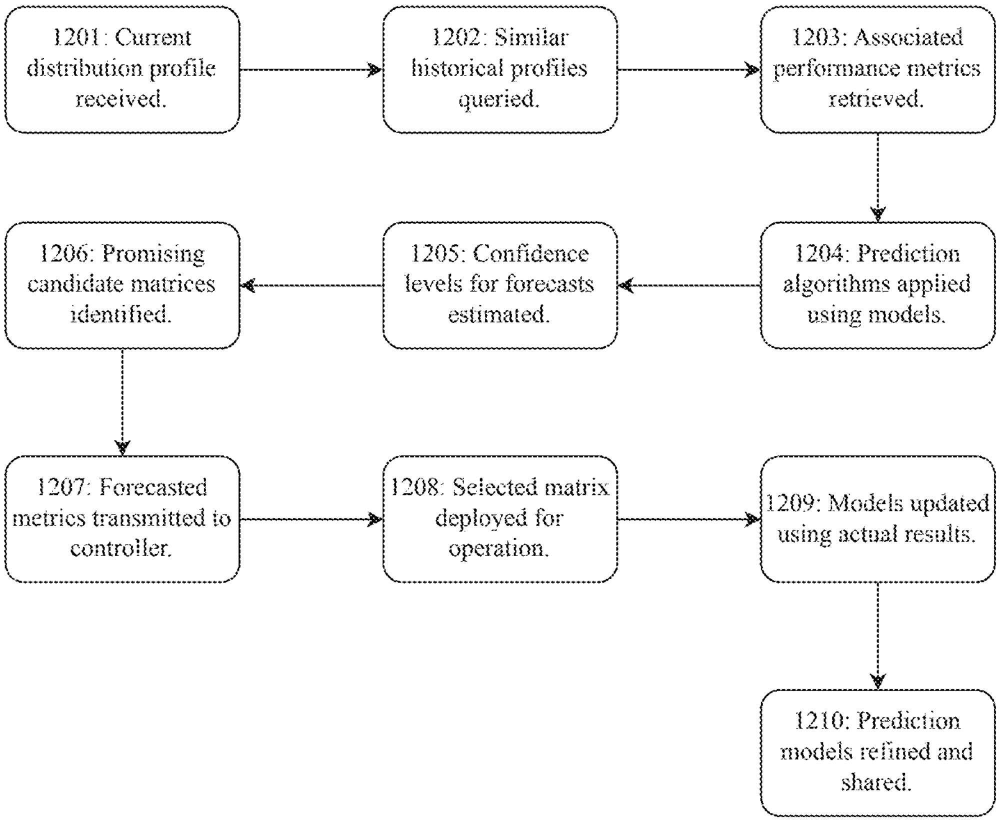
FIG. 12 illustrates an exemplary performance prediction process flow showing reception of current distribution profiles, similarity matching with historical data, forecasting of performance metrics using trained models, confidence estimation, selection of promising matrices, deployment guidance, and model updates through online learning.

FIG. 12 is a flow diagram illustrating exemplary performance prediction within a collaborative transformation matrix learning system 100, in an embodiment. A performance prediction engine 155 receives a current distribution profile from a data distribution analyzer 102 that has detected changes in statistical patterns of incoming data streams requiring evaluation of candidate transformation matrices 1201. The performance prediction engine 155 queries a matrix performance repository 120 for similar historical distribution profiles by computing distance metrics such as Euclidean distance, cosine similarity, or Mahalanobis distance between current and stored distribution profiles associated with previously validated matrices 1202. The performance prediction engine 155 retrieves associated performance metrics for similar patterns including compression efficiency, cryptographic strength, and computational overhead measurements that were recorded when historical matrices were applied to data matching the similar distribution profiles 1203. The performance prediction engine 155 applies similarity-based prediction algorithms using machine learning models such as k-nearest neighbors, regression models, or neural network predictors trained on historical performance data to forecast expected effectiveness of candidate matrices under current conditions 1204. The performance prediction engine 155 estimates confidence levels for forecasted results based on data density in relevant regions of the distribution space, consistency of historical performance patterns, and the degree of extrapolation required for the current distribution profile 1205. The performance prediction engine 155 identifies promising candidate matrices by selecting configurations whose predicted performance exceeds predefined thresholds across compression efficiency, cryptographic strength, and computational overhead dimensions while meeting minimum confidence requirements 1206. The performance prediction engine 155 transmits forecasted performance metrics and confidence estimates to a matrix selection controller 160 for use in guiding deployment decisions 1207. The matrix selection controller 160 deploys the selected matrix to a transformation matrix generator 104 based on comprehensive evaluation of predictions, trust scores, and other selection criteria 1208. The performance prediction engine 155 updates its models based on actual measured performance by comparing forecasted metrics against observed results collected during matrix operation, implementing online learning algorithms that adjust model parameters to improve future prediction accuracy 1209. The performance prediction process concludes with refined models that incorporate new knowledge about relationships between distribution characteristics, matrix properties, and resulting performance outcomes, with updated prediction parameters optionally shared with a collaborative learning coordinator 110 to enhance network-wide learning consistency 1210.

Figure 13:
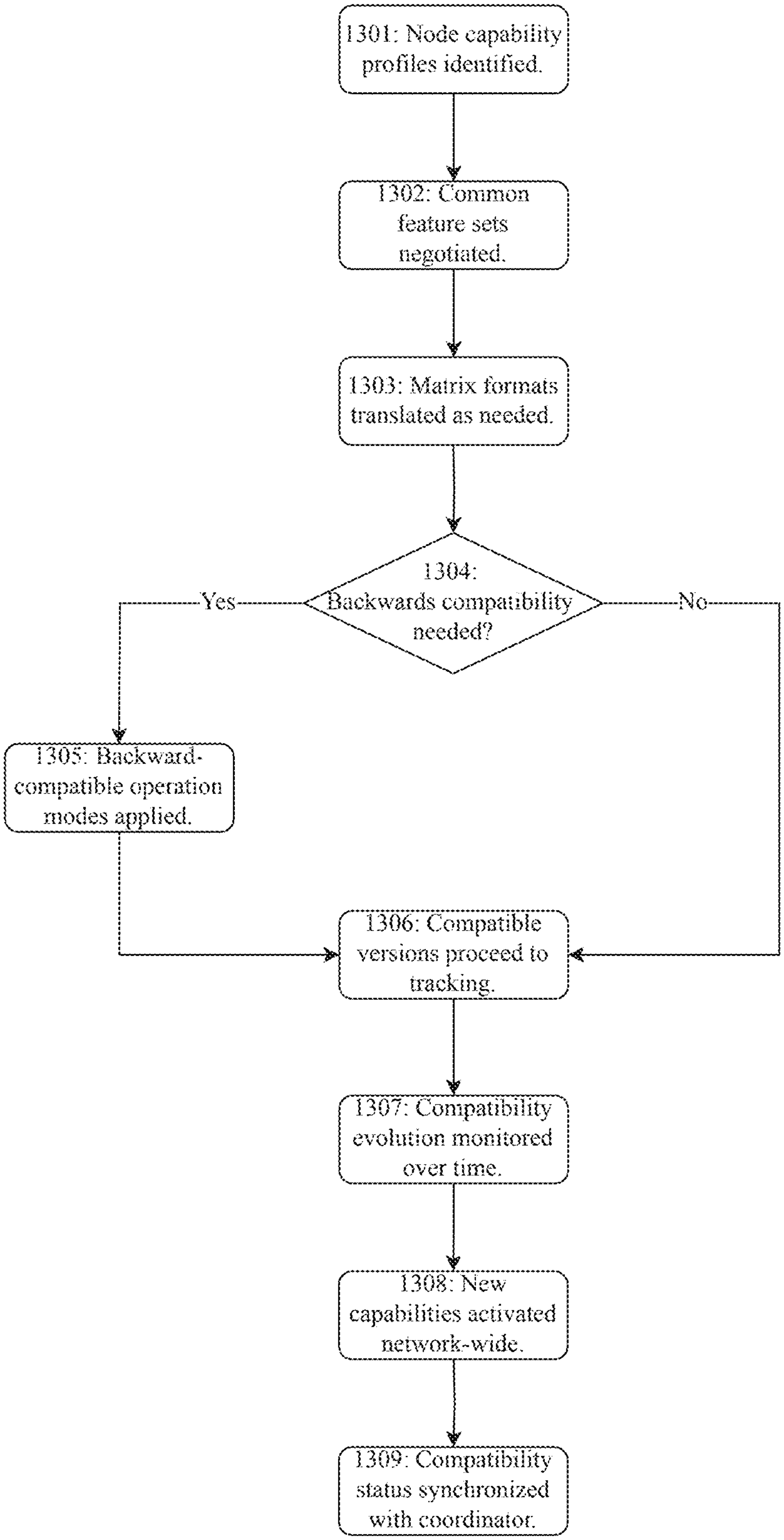
FIG. 13 illustrates an exemplary deployment compatibility handling process flow showing identification of node capability profiles, negotiation of common feature sets, translation of matrix formats between versions, application of backward-compatible operation modes, tracking of version evolution, and activation of new capabilities across the network.

FIG. 13 is a flow diagram illustrating exemplary deployment compatibility handling within a collaborative transformation matrix learning system 100, in an embodiment. A deployment compatibility manager 150 identifies capability profiles of participating nodes in the collaborative network by querying each node for supported operational modes, matrix dimensionality constraints, performance metric definitions, and version-specific algorithm implementations 1301. The deployment compatibility manager 150 negotiates common feature sets between different versions by analyzing capability profiles to determine which collaborative learning functions are universally supported and which advanced features are available only to subsets of nodes running newer system versions 1302. The deployment compatibility manager 150 translates matrices between different representation formats when necessary to ensure that transformation matrix configurations generated by one system version can be properly interpreted and utilized by nodes operating different versions with varying internal data structures 1303. The deployment compatibility manager 150 evaluates whether backward compatibility is required based on detecting significant version differences between the local node and contributing nodes that could cause matrices to behave unexpectedly if shared without translation or operational restrictions 1304. When backward compatibility is required due to version mismatches, the deployment compatibility manager 150 applies backward-compatible operation modes that limit shared insights to matrix configurations and performance metrics that all participating versions can safely process without encountering undefined behaviors or incompatible features 1305. When backward compatibility is not required because participating nodes operate compatible versions, the deployment compatibility manager 150 proceeds directly to tracking compatibility requirements 1306. The deployment compatibility manager 150 tracks evolution of compatibility requirements over time by monitoring version distributions across the collaborative network and identifying when sufficient nodes have upgraded to support new collaborative learning capabilities previously unavailable 1307. The deployment compatibility manager 150 coordinates activation of new capabilities across the network by signaling when version thresholds have been reached and initiating protocols that enable advanced features such as enhanced privacy mechanisms, expanded matrix dimensionality support, or improved performance prediction algorithms 1308. The deployment compatibility handling process concludes with maintained interoperability across heterogeneous deployments while enabling progressive enhancement of collaborative learning capabilities as the network evolves, with updated compatibility status communicated to a collaborative learning coordinator 110 to synchronize network-wide capability awareness 1309.

Figure 14:
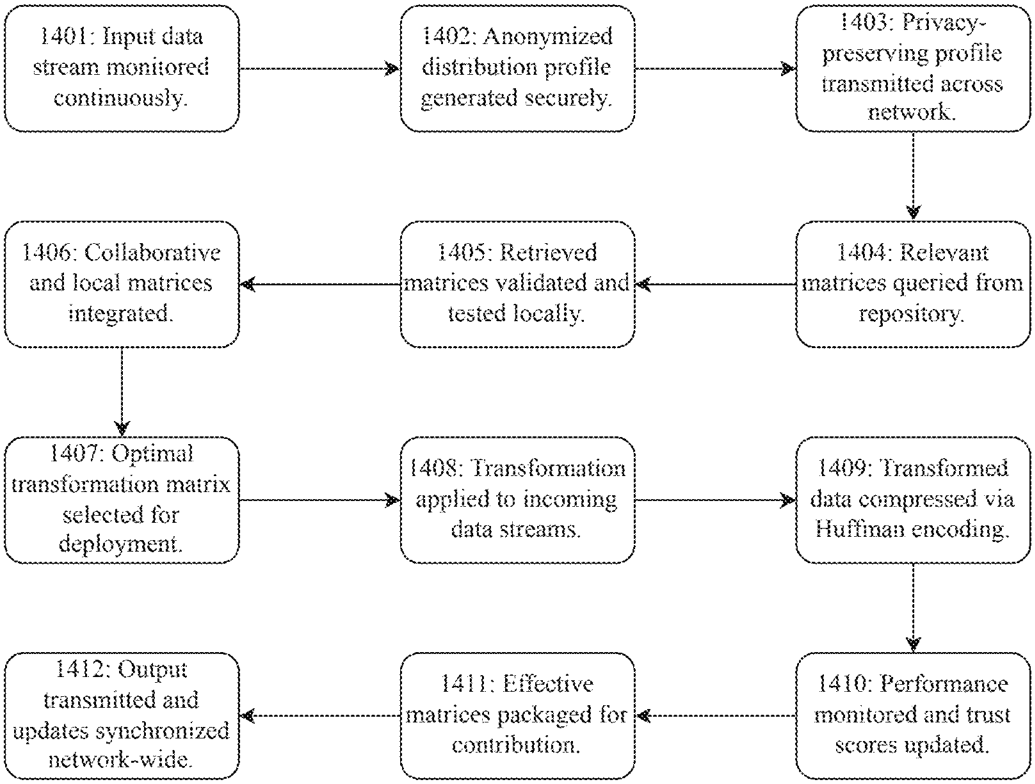
FIG. 14 illustrates an exemplary end-to-end collaborative data flow showing progression from data analysis and anonymized profile generation through collaborative matrix retrieval, validation, integration, deployment, compression, and feedback, culminating in synchronized knowledge updates across the distributed network.

FIG. 14 is a flow diagram illustrating exemplary end-to-end collaborative data flow within a collaborative transformation matrix learning system 100, in an embodiment. An input data stream 101 flows into a data distribution analyzer 102 which continuously monitors statistical properties of incoming data to detect changes in distribution patterns that trigger adaptive matrix optimization processes 1401. The data distribution analyzer 102 communicates detected distribution changes to a distribution profile generator 115 which creates an anonymized representation of current distribution characteristics using differential privacy mechanisms and dimensionality reduction techniques to protect sensitive information 1402. The distribution profile generator 115 transmits the privacy-preserving distribution profile to a network synchronization manager 145 which coordinates timing and transmission of the profile across secure communication channels to other participating nodes in the collaborative network 1403. A matrix performance repository 120 receives a query for relevant transformation matrices based on similarity matching between the current distribution profile and historical profiles associated with previously validated matrices stored in the repository 1404. A trust and validation engine 125 validates retrieved matrices from remote nodes by verifying mathematical properties including row-stochastic constraints, applying matrices to local test datasets, measuring actual performance, and comparing results against claimed metrics while considering trust scores of contributing nodes 1405. A federated matrix constructor 140 integrates collaborative insights from validated remotely sourced matrices with locally generated candidate matrices from a dynamic matrix constructor 103 to create a comprehensive ensemble of optimization options informed by both collective intelligence and local observations 1406. A matrix selection controller 160 evaluates the ensemble of candidate matrices using performance predictions from a performance prediction engine 155, trust scores from the trust and validation engine 125, and conflict resolution guidance from a conflict resolution manager 135 to deploy an optimal transformation matrix configuration 1407. A transformation matrix generator 104 receives the deployed matrix from the matrix selection controller 160 and provides the configuration to a dyadic distribution module 105 which applies the transformation to incoming data streams, generating a main stream of transformed data and a secondary stream containing transformation information 1408. The transformed main data stream flows from the dyadic distribution module 105 to a Huffman encoder/decoder 106 which compresses the data using algorithms optimized for the dyadic distribution properties created by the applied transformation matrix 1409. The system monitors performance of the deployed matrix during operation by measuring actual compression efficiency, cryptographic strength, and computational overhead, comparing observed results against predictions and updating trust scores based on validation accuracy 1410. The federated matrix constructor 140 identifies effective matrix configurations generated through local innovation or collaborative adaptation, packaging these matrices with associated metadata, performance metrics, and distribution profiles for contribution back to the collaborative network 1411. The compressed and encrypted output stream 199 is transmitted or stored while contributed matrices and insights propagate through the network synchronization manager 145 to other participating nodes, with updates recorded by a collaborative learning coordinator 110 to maintain network-wide synchronization and enable continuous improvement of collaborative knowledge across the distributed deployment environment 1412.

Exemplary Computing Environment

Figure 15:
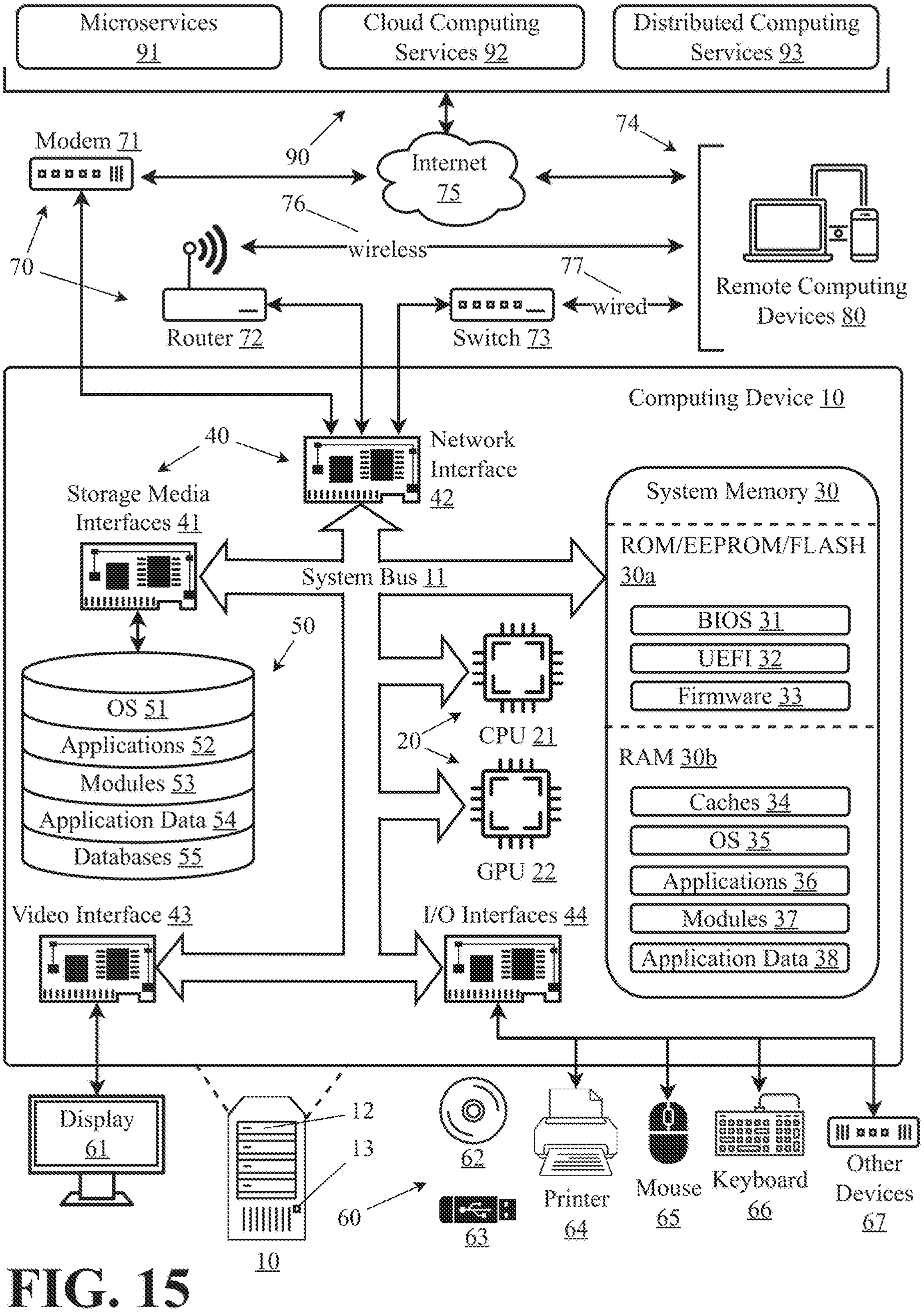
FIG. 15 illustrates an exemplary computing environment on which an embodiment described herein may be implemented.

FIG. 15 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory 30*a* is not erased when power to the memory is removed, and includes memory types such as read only memory (ROM), electronically-erasable programmable memory (EEPROM), and rewritable solid state memory (commonly known as “flash memory”). Non-volatile memory 30*a* is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30*a* may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30*b* is erased when power to the memory is removed and is typically used for short-term storage of data for processing. Volatile memory 30*b* includes memory types such as random-access memory (RAM), and is normally the primary operating memory into which the operating system 35, applications 36, program modules 37, and application data 38 are loaded for execution by processors 20. Volatile memory 30*b* is generally faster than non-volatile memory 30*a* due to its electrical characteristics and is directly accessible to processors 20 for processing of instructions and data storage and retrieval. Volatile memory 30*b* may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form-Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces. Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Containerd provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance or uncertainty over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A computer system comprising a hardware memory, wherein the computer system is configured to execute software instructions stored on nontransitory machine-readable storage media that:

analyze an input data stream to determine its properties;

create a transformation matrix based on the properties of the input data;

transform the input data into a modified statistical distribution of symbols, the modified statistical distribution comprising a dyadic distribution shaped according to the transformation matrix;

generate a main data stream of transformed input data and a secondary data stream of transformation information associated with the modified statistical distribution;

compress the main data stream;

combine the compressed main data stream and the secondary data stream into an output stream;

implement security measures to protect the output stream;

monitor the input data stream to detect changes in statistical distribution patterns of the input data stream;

generate updated transformation matrices in response to detected changes in the statistical distribution patterns of the input data stream;

select and deploy an optimal transformation matrix based on performance evaluation criteria;

generate a privacy-preserving distribution profile representing characteristics of the statistical distribution patterns using differential privacy mechanisms;

communicate with at least one remote node in a collaborative network via secure communication channels to exchange the privacy-preserving distribution profile and transformation matrix configurations with associated performance metrics, the exchange including receiving a remotely-sourced transformation matrix from the at least one remote node;

validate the remotely-sourced transformation matrix by verifying mathematical properties and performance claims; and integrate the validated remotely-sourced transformation matrix into local matrix selection based on performance evaluation criteria that include the associated performance metrics.

2. The computer system of claim 1, wherein validating the remotely-sourced transformation matrix comprises verifying that the remotely-sourced transformation matrix maintains row-stochastic properties required by a dyadic distribution algorithm.

3. The computer system of claim 2, wherein the software instructions further update a trust score assigned to the at least one remote node based on comparing actual performance of the validated remotely-sourced transformation matrix against the associated performance metrics.

4. The computer system of claim 1, wherein the software instructions further assign a trust score to the at least one remote node based on historical accuracy of previously received transformation matrices, and wherein integrating the validated remotely-sourced transformation matrix is further conditioned on the trust score exceeding a predetermined threshold.

5. The computer system of claim 1, wherein the software instructions further apply the remotely-sourced transformation matrix to test data samples to measure actual compression efficiency, and wherein integration occurs only when the actual compression efficiency meets or exceeds compression efficiency values in the associated performance metrics.

6. The computer system of claim 1, wherein generating the privacy-preserving distribution profile comprises applying dimensionality reduction to detailed distribution statistics to create a fixed-dimensionality profile vector that preserves essential distribution characteristics while preventing reconstruction of individual data points.

7. The computer system of claim 1, wherein the software instructions further maintain a local repository of transformation matrix configurations received from the at least one remote node, index the repository based on similarity between distribution profiles associated with the transformation matrix configurations, and retrieve candidate transformation matrices from the repository when generating updated transformation matrices in response to detected changes.

8. The computer system of claim 1, wherein the software instructions further detect a conflict between local performance measurements and the associated performance metrics of the remotely-sourced transformation matrix, and resolve the conflict by adjusting a trust score associated with the at least one remote node.

9. A method comprising:

analyzing an input data stream to determine its properties;

creating a transformation matrix based on the properties of the input data;

transforming the input data into a modified statistical distribution of symbols, the modified statistical distribution comprising a dyadic distribution shaped according to the transformation matrix;

generating a main data stream of transformed input data and a secondary data stream of transformation information associated with the modified statistical distribution;

compressing the main data stream;

combining the compressed main data stream and the secondary data stream into an output stream;

implementing security measures to protect the output stream;

monitoring the input data stream to detect changes in statistical distribution patterns of the input data stream;

generating updated transformation matrices in response to detected changes in the statistical distribution patterns of the input data stream;

selecting and deploying an optimal transformation matrix based on performance evaluation criteria;

generating a privacy-preserving distribution profile representing characteristics of the statistical distribution patterns using differential privacy mechanisms;

communicating with at least one remote node in a collaborative network via secure communication channels to exchange the privacy-preserving distribution profile and transformation matrix configurations with associated performance metrics, the exchange including receiving a remotely-sourced transformation matrix from the at least one remote node;

validating a remotely-sourced transformation matrix received from the at least one remote node by verifying mathematical properties and performance claims; and integrating the validated remotely-sourced transformation matrix into local matrix selection based on performance evaluation criteria that include the associated performance metrics.

10. The method of claim 9, wherein validating the remotely-sourced transformation matrix comprises verifying that the remotely-sourced transformation matrix maintains row-stochastic properties required by a dyadic distribution algorithm.

11. The method of claim 10, further comprising updating a trust score assigned to the at least one remote node based on comparing actual performance of the validated remotely-sourced transformation matrix against the associated performance metrics.

12. The method of claim 9, further comprising assigning a trust score to the at least one remote node based on historical accuracy of previously received transformation matrices, and wherein integrating the validated remotely-sourced transformation matrix is further conditioned on the trust score exceeding a predetermined threshold.

13. The method of claim 9, further comprising applying the remotely-sourced transformation matrix to test data samples to measure actual compression efficiency, and wherein integration occurs only when the actual compression efficiency meets or exceeds compression efficiency values in the associated performance metrics.

14. The method of claim 9, wherein generating the privacy-preserving distribution profile comprises applying dimensionality reduction to detailed distribution statistics to create a fixed-dimensionality profile vector that preserves essential distribution characteristics while preventing reconstruction of individual data points.

15. The method of claim 9, further comprising maintaining a local repository of transformation matrix configurations received from the at least one remote node, indexing the repository based on similarity between distribution profiles associated with the transformation matrix configurations, and retrieving candidate transformation matrices from the repository when generating updated transformation matrices in response to detected changes.

16. The method of claim 9, further comprising detecting a conflict between local performance measurements and the associated performance metrics of the remotely-sourced transformation matrix, and resolving the conflict by adjusting a trust score associated with the at least one remote node.

* * * * *